United States Patent
Andrews et al.

(10) Patent No.: US 7,744,717 B2
(45) Date of Patent: Jun. 29, 2010

(54) PROCESS FOR ENHANCING THE RESOLUTION OF A THERMALLY TRANSFERRED PATTERN

(75) Inventors: Gerald Donald Andrews, Hockessin, DE (US); Richard Kevin Bailey, Newark, DE (US); Graciela Beatriz Blanchet, Wilmington, DE (US); John W. Catron, Smyrna, DE (US); Feng Gao, Hockessin, DE (US); Gary Delmar Jaycox, West Chester, PA (US); Lynda Kaye Johnson, Wilmington, DE (US); Roupen Leon Keusseyan, Raleigh, NC (US); Jeffrey Scott Meth, Landenberg, PA (US); Frank S. Principe, Landenberg, PA (US); Rinaldo S. Schiffino, Wilmington, DE (US); Robert Mar Yohannan, Rutledge, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 161 days.

(21) Appl. No.: 11/789,842

(22) Filed: Apr. 25, 2007

(65) Prior Publication Data

US 2008/0012163 A1 Jan. 17, 2008

Related U.S. Application Data

(63) Continuation of application No. 11/488,258, filed on Jul. 17, 2006, now abandoned.

(51) Int. Cl.
*B29C 65/00* (2006.01)
*B32B 37/00* (2006.01)
*B32B 38/10* (2006.01)
*H01L 29/08* (2006.01)
*H01L 35/24* (2006.01)
*H01L 51/00* (2006.01)

(52) U.S. Cl. ......................... 156/247; 257/40
(58) Field of Classification Search ................. 156/247; 257/40
See application file for complete search history.

(56) References Cited

U.S. PATENT DOCUMENTS 5,155,003 A * 10/1992 Chang ......................... 430/200

(Continued)

FOREIGN PATENT DOCUMENTS

EP        1 243 438 A      9/2002

(Continued)

OTHER PUBLICATIONS

"Conduction" The Phsycis Hyperbook, 1998-2005 by Glen Elert http://web.archive.org/web/20050626083650/http://hypertextbook.com/physics/thermal/conduction/.*

(Continued)

*Primary Examiner*—Philip C Tucker
*Assistant Examiner*—Michael N Orlando

(57) ABSTRACT

Provided are processes for enhancing the resolution of a thermally transferred pattern on an imaged thermal transfer receiver, wherein the imaged thermal transfer receiver comprises a surface having an exposed portion and a non-exposed portion of one or more thermally transferred layer(s), comprising: (a) contacting said surface with an adhesive layer for a contact period to provide a laminate; (b) separating said adhesive layer from the laminate to provide a treated thermal transfer receiver having a surface substantially free of said non-exposed portion of one or more thermally transferred layer(s). The processes are useful in the fabrication of electronic devices including thin film transistors, circuits, electromagnetic interference shields, touchpad sensors and other electronic devices.

18 Claims, 7 Drawing Sheets

U.S. PATENT DOCUMENTS

| | | | |
|---|---|---|---|
| 5,256,506 A | | 10/1993 | Ellis et al. |
| 5,272,375 A | * | 12/1993 | Belopolsky ................. 257/717 |
| 5,362,826 A | | 11/1994 | Berge et al. |
| 5,370,825 A | | 12/1994 | Angelopoulos et al. |
| 5,863,465 A | | 1/1999 | Kinlen |
| 5,937,272 A | | 8/1999 | Tang |
| 6,140,009 A | * | 10/2000 | Wolk et al. ............... 430/273.1 |
| 6,146,792 A | | 11/2000 | Blanchet-Fincher et al. |
| 6,228,555 B1 | | 5/2001 | Hoffend, Jr. et al. |
| 2002/0149315 A1 | | 10/2002 | Blanchet-Fincher et al. |
| 2005/0082523 A1 | | 4/2005 | Blanchet-Fincher et al. |
| 2005/0116202 A1 | | 6/2005 | Gao et al. |
| 2007/0003603 A1 | * | 1/2007 | Karandikar et al. ......... 424/443 |

FOREIGN PATENT DOCUMENTS

| | | |
|---|---|---|
| JP | 09 039278 A | 2/1997 |
| WO | 02/070271 A | 9/2002 |
| WO | 03/099574 A1 | 12/2003 |
| WO | 2005/038009 A2 | 4/2005 |
| WO | 2005/038010 A2 | 4/2005 |
| WO | 2005/039868 A | 5/2005 |

OTHER PUBLICATIONS

International Search Report for International Application No. PCT/US2007/016117 Dated Apr. 2, 2008 (3 Pages).
Ed. G. Schmid, Nanoparticles: From Theory to Application, 2004, Wiley-VCH, Weinheim (Book Not Included).
K. J. Klabunde, Nanoscale Materials in Chemistry, 2001, Wiley-Interscience, New York (Book Not Included).
Ed. G. Wypych, Handbook of Plasticizers, 2004, Chemtec Publishing, Toronto, Ontario (Book Not Included).
M. Matsuoka, Infrared Absorbing Materials, 1990, Plenum Press, New York (Book Not Included).
M. Matsuoka, Absorption Spectra of Dyes for Diode Lasers, 1990, Bunshin Publishing Co., Tokyo (Book Not Included).
S. M. Sze, Physics of Semiconductor Devices, 2nd Edition, 1981, John Wiley and Sons, New York (Book Not Included).
J. L. Bredas, Handbook of Conducting Polymers, 1986, vol. 2, Chapter 25, Marcel Dekker, Inc., New York (Book Not Included).
MacDiarmid, Synthetic Metals: A Novel Role for Organic Polymers (Nobel Lecture), A. G. Angew. Chem. Int. Ed., 2001, pp. 2581-2590, vol. 40.
Heeger, Semiconducting and Metallic Polymers: The Fourth Generation of Polymeric Materials (Nobel Lecture), A. G. Angew. Chem. Int. Ed., 2001, pp. 2591-2611, vol. 40.

* cited by examiner

PROCESS FOR ENHANCING THE RESOLUTION OF A THERMALLY TRANSFERRED PATTERN

RELATED APPLICATIONS

The current application is a continuation of application Ser. No. 11/488,258 filed Jul. 17, 2006 which is now abandoned.

This invention was made with United States Government support under Agreement No. 70NANB2H03032 awarded by NIST Advanced Technology Program. The United States Government has certain rights in the invention.

FIELD OF INVENTION

The invention relates to a process for enhancing the resolution of a thermally transferred pattern on an imaged thermal transfer receiver using an adhesive layer. The invention is useful in forming electrical circuits and display components.

BACKGROUND OF INVENTION

Thermal transfer processes are well known in applications such as color proofing as a means of dry transferring or printing of dye and/or pigment layers. Such thermal transfer processes typically use a laser to induce the image-wise thermal transfer of material.

Laser-induced thermal transfer processes typically use a donor element, including a layer of material to be transferred, referred to herein as a transfer layer, and a receiver element, including a surface for receiving the transferred material. Either the substrate of the donor element or the receiver element is transparent, or both are transparent. The donor element and receiver element are brought into close proximity or into contact with each other and selectively exposed to laser radiation, usually by an infrared laser. Heat is generated in the exposed portions of the transfer layer, causing the transfer of those portions of the transfer layer onto the surface of the receiver element. If the material of the transfer layer does not absorb the incoming laser radiation, the donor element should include a heating layer, also known as a light-to-heat conversion (LTHC) layer or a transfer-assist layer, in addition to the transfer layer.

In a typical laser-induced digital thermal transfer process the exposure takes place only in a small, selected region of the assembly at a time, so that transfer of material from the donor element to the receiver element can be built up one region at a time. The region may be a pixel, some portion of a pixel or a plurality of pixels. Computer control facilitates the transfer at high speed and high resolution. Alternatively, in an analog process, the entire assembly is irradiated and a mask is used to selectively expose desired portions of the thermally imageable layer, see for instance, U.S. Pat. No. 5,937,272.

A particular need for printable electronics includes thermally imageable insulating layers; conducting metal layers; conducting polymer layers; color layers; semiconductor layers and light emitting layers, among others. Thermal printing of these various layers requires very efficient and clean transfer processes in order to ultimately provide a functioning electrical device of sufficient quality. In some instances, depending upon the nature of the donor and receiver elements and the transfer processing parameters, when the donor element and the receiver element are separated after thermal transfer, the receiver element includes both exposed portions and some non-exposed portions of one or more transfer layers. A process is needed to enhance the resolution of the thermally transferred pattern on a thermal transfer receiver by removal of the non-exposed portions of various transferred transfer layers, preferably using a dry process; that is, without the use of solvents.

SUMMARY OF INVENTION

One aspect of the invention is a process for enhancing the resolution of a thermally transferred pattern on an imaged thermal transfer receiver, wherein the imaged thermal transfer receiver comprises a surface having an exposed portion and a non-exposed portion of one or more thermally transferred layer(s), comprising: (a) contacting said surface with an adhesive layer for a contact period to provide a laminate; (b) separating said adhesive layer from the laminate to provide a treated thermal transfer receiver having a surface substantially free of said non-exposed portion of one or more thermally transferred layer(s).

DETAILED DESCRIPTION

Figure 1A:
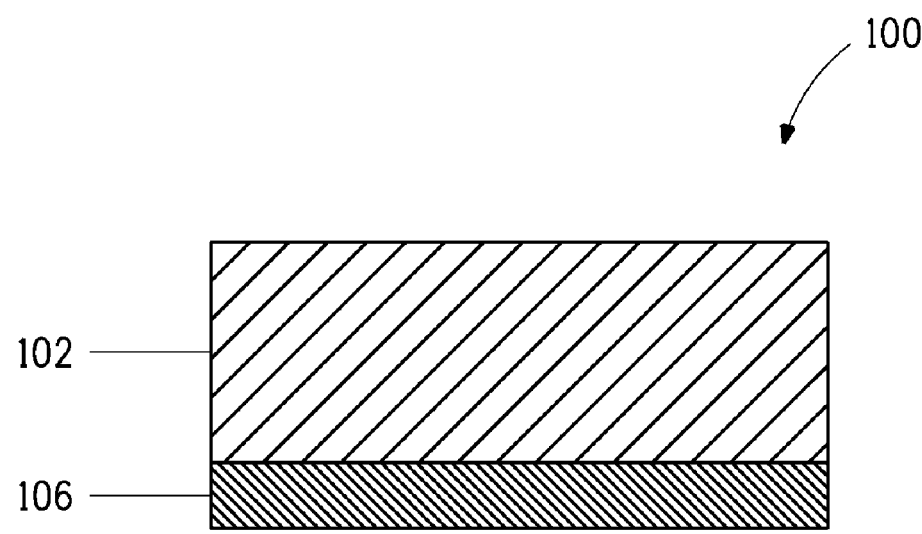
FIGS. 1A and 1B are cross-sectional views of thermal imaging dielectric donors useful in some embodiments of the invention in forming TFTs.

Herein the terms "acrylic", "acrylic resin", "(meth)acrylic resins", and "acrylic polymers", are synonymous unless specifically defined otherwise. These terms refer to the general class of addition polymers derived from the conventional polymerization of ethylenically unsaturated monomers derived from methacrylic and acrylic acids and alkyl and substituted-alkyl esters thereof. The terms encompass homopolymers and copolymers. The terms encompass specifically the homopolymers and copolymers of methyl(meth)acrylate, ethyl(meth)acrylate, butyl(meth)acrylate, 2-hydroxyethyl(meth)acrylate, (meth)acrylic acid and glycidyl (meth)acrylate. The term copolymer herein encompasses polymers derived from polymerization of two or more monomers and includes graft copolymers, unless specifically defined otherwise. The term (meth)acrylic acid encompasses both methacrylic acid and acrylic acid. The term (meth)acrylate, encompasses methacrylate and acrylate. The terms "styrene acrylic polymers", "acrylic styrene" and "styrene acrylic" are synonymous and encompass copolymers of the above described "acrylic resins" with styrene and substituted styrene monomers, for instance alpha-methyl styrene.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of embodiments of the present invention, suitable methods and materials are described below. All publications, patent applications, patents, and other references mentioned herein are incorporated by reference in their entirety, unless a particular passage is cited. In case of conflict, the present specification, including definitions, will control. In addition, the materials, methods, and examples are illustrative only and not intended to be limiting.

To the extent not described herein, many details regarding specific materials, processing acts, and circuits are conventional and may be found in textbooks and other sources within the organic light-emitting diode display, photodetector, photovoltaic, and semiconductive member arts.

To appreciate the usefulness of the invention in fabrication of TFTs and other electronic components we first describe a variety of thermal transfer layers and multilayer donors and receivers that are useful in dry-transfer of electronic components. Herein the term "thermal transfer layer" encompasses nanoparticle layers, dielectric layers, conductive polymer layers, resistive layers, light-emitting layers, color filter layers and additional transfer layers and is a layer that undergoes transfer from a thermal transfer donor to a thermal transfer receiver in the process of thermal transfer patterning as herein disclosed. Herein the term "imaging" and "patterning" are synonymous and "image" and "pattern" are synonymous.

Nanoparticle and Nanoparticle Layer

The term "nanoparticle" or "nanoparticle layer" is meant to include nanoparticles, nanorods, nanowires, nanotubes, and nanostructures that are characterized by an average longest dimension of about 5 nm to about 1500 nm and preferably, about 5 nm to about 500 nm. Wherein the particles are generally of spherical shape, the nanoparticles preferably have an average particle size of about 5 to about 1500 nm, and more preferably, about 5 to 500 nm. Scientific references that provide an overview and specific details of "nanoparticles" include "Nanoparticles: From Theory to Application" G. Schmid, (Wiley-VCH, Weinheim, 2004) and "Nanoscale Materials in Chemistry" K. J. Klabunde, (Wiley-Interscience, New York, 2001), hereby incorporated by reference. These references provide an understanding of nanoparticle synthesis, behavior and applications. The nanoparticles can be organic particles, inorganic particles or a combination. For instance, the nanoparticles may have an inorganic core, and a surface coating of organic material, if so desired, that is physically adsorbed to the nanoparticles or chemically bonded. Methods for surface-coating inorganic nanoparticles are well known in the art. Many suppliers of nanoparticles use undisclosed or proprietary surface coatings that act as dispersing aids. Throughout the specification, all reference to wt % of nanoparticles is meant to include the undisclosed or proprietary coatings that the manufacturer may, or may not, add as a dispersant aid. For instance, a commercial silver nanopowder is considered nominally 100 wt % silver, though it may have present an undisclosed dispersant.

Nanoparticle layers useful in the invention can be electrically, magnetically, or optically functional layers and include semiconducting; resistive; dielectric; conducting; superconducting; light-producing, e.g., luminescing, light-emitting, fluorescing or phosphorescing; electron-producing; hole-producing; ferroelectric; piezoelectric; ferritic; electro-optical; magnetic; light absorbing, reflecting, diffracting, scattering, dispersing, refracting, or diffusing; and refractive index modifying layers. Nanoparticles useful in forming conducting nanoparticle layers include conducting particles such as: carbon black, carbon nanotubes and metal-coated carbon nanotubes; metal particles such as: gold, silver, copper, iron, nickel, cobalt, platinum, palladium, chromium, molybdenum, tungsten, tantalum, tin, indium, lanthanum, gadolinium, ruthenium, titanium, yttrium, europium, gallium, zinc, magnesium, barium, cerium, strontium, lead, and antimony; doped and undoped metal oxide particles including transparent conductive oxides such as indium-tin-oxide (ITO), antimony-tin-oxide (ATO), tin oxide, fluorine-doped tin oxide, zinc oxide, aluminum-doped zinc oxide (AZO), and zinc tin oxide (ZTO); alloys thereof, composites thereof and core-shell structures thereof. Preferred conducting nanoparticles are selected from the group consisting of: gold, silver, copper, and alloys thereof; ITO, ATO, and carbon nanotubes. More preferred are silver nanoparticles with an average longest dimension of about 5 nm to about 1500 nm, and most preferred are silver nanoparticles with an average particle size of about 200 nm to about 400 nm.

Nanoparticles useful in forming dielectric nanoparticle layers include dielectric particles such as: silicon dioxide, silicon nitride, alumina, titanates, zirconates, niobates, stannates, other mixed metal oxides, $TiO_2$, $Ta_2O_5$, $SrTiO_3$, $BaTiO_3$, $CaTiO_3$, $PbTiO_3$, $CaZrO_3$, $BaZrO_3$, $CaSnO_3$, $BaSnO_3$, $Al_2O_3$, $ZrO_2$, $Bi_4Ti_3O_{12}$, $BaMgF_4$, $PbZr_xTi_{1-x}O_3$, $PbMg_{1/3}Nb_{2/3}O_3$, $Zr_{0.7}Sn_{0.3}TiO_4$, $Zr_{0.4}Sn_{0.66}Ti_{0.94}O_4$, $CaZr_{0.98}Ti_{0.02}O_3$, $SrZr_{0.94}Ti_{0.06}O_3$, $BaNd_2Ti_5O_{14}$, $Pb_2Ta_2O_7$, barium zirconium titanate, barium strontium titanate, barium neodymium titanate, lead magnesium niobate, lead zinc niobate, lead zirconate, cadmium niobate, other titanates and tantalates of strontium, lead, calcium, magnesium, zinc and neodymium, various other pyrochlores and other highly polar inorganic material. Preferred dielectric nanoparticles are selected from the group consisting of: barium titanate, strontium titanate, barium strontium titanate, silicon dioxide, aluminum oxide, and titanium dioxide.

Dielectric Layers

Another material useful in fabricating TFTs and other electronic devices using the invention is a dielectric layer having a resistivity of about $10^{14}$ ohm-cm or greater comprising at least one layer of material, herein referred to as Layer A, comprising: one or more dielectric polymers selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy) styrene, poly(4-hydroxy)styrene, and copolymers of poly(4-hydroxy)styrene with hydroxyethyl(meth)acrylate, alkyl (meth)acrylate, styrene, and alkyl-substituted styrene wherein the alkyl group is a C1 to C18 straight or branched chain alkyl group; phenol-aldehyde (co)polymers and (co) oligomers and combinations thereof; and poly(vinyl acetate); and about 0.5 wt % to about 10 wt %, based on the dry weight of the Layer A, of one or more near-IR dye(s) having an absorption maximum in the range of about 600 to about 1200 nm within Layer A. The term dielectric polymers herein encompasses homopolymers, copolymers derived from polymerization of two or more monomers, post-derivatized (co) polymers including graft (co)polymers, and low molecular weight homopolymers or copolymers. The polymers may be linear, branched, hyperbranched or dendritic.

Preferred dielectric polymers for Layer A include acrylic, styrenic and styrenic-acrylic latexes comprising alkyl(meth) acrylate, styrene, and alkyl-substituted styrene wherein the alkyl group is a C1 to C18 straight or branched chain alkyl group. Preferred optional monomers for these latex-based polymers include (meth)acrylic acid, hydroxyethyl(meth) acrylate and glycidyl(meth)acrylate. More preferred acrylic, styrenic and styrenic-acrylic latexes are selected from the group: Latexes A, defined herein as one or more latex resins comprising at least about 85 wt %, preferably at least about 90 wt %, and more preferably at least about 95 wt %, of monomers selected from the group consisting of: alkyl (meth) acrylate, styrene, and alkyl-substituted styrene wherein the alkyl group is a C1 to C18 straight or branched chain alkyl group. Preferred optional monomers for these latex resins include (meth)acrylic acid, preferably up to about 5 wt %, hydroxyethyl(meth)acrylate, preferably up to about 10 wt %, and glycidyl(meth)acrylate, preferably up to about 5 wt %. Preferably the latexes have an average particle size of less than about 150 nm, more preferably, less than about 100 nm, and an acid number less than about 100, preferably less than about 75, and more preferably less than about 25.

Particularly preferred polymers for Layer A with high resistivity (above $10^{14}$ ohm-cm) are Acrylic Latexes B and Styrene-Acrylic Latexes C and combinations thereof. Acrylic Latexes B are defined herein as one or more acrylic latexes comprising at least about 85 wt %, preferably at least about 90 wt %, and more preferably at least about 95 wt %, of monomers selected from the group consisting of: methyl methacrylate and butyl acrylate. Styrene-Acrylic Latexes C are defined herein as one or more styrene-acrylic latexes comprising at least about 85 wt %, preferably at least about 90 wt %, and more preferably at least about 95 wt %, of monomers selected from the group consisting of: methyl methacrylate, butyl acrylate and styrene. Preferred optional monomers for Acrylic Latexes B and Styrene-Acrylic Latexes C are selected from the group consisting of: (meth)acrylic acid, preferably up to about 5 wt %, hydroxyethyl methacrylate, preferably up to about 10 wt %, and glycidyl methacrylate, preferably up to about 5 wt %. Commercial examples of acrylic and styrenic acrylic latexes useful as dielectric polymers include Joncryl® 95 and 1915 (co)polymers (Johnson Polymer). Methods for synthesizing suitable latex polymers have been reported in WO 03/099574.

Further preferred dielectric polymers for Layer A include solution-based acrylic, styrenic and styrenic-acrylic polymers. Herein the term "solution-based" refers to materials that are soluble in solvents such as water and/or one or more common organic solvents including alcohols, e.g. ethanol and butoxyethanol; ethers, e.g. dimethoxyethane; esters, e.g. ethyl and butyl acetate; ketones, e.g., acetone and 2-butanone; and aromatic hydrocarbons, e.g. xylenes. Preferred solution-based acrylic, styrenic and styrenic-acrylic polymers have a $M_w$ of less than about 100,000, preferably less than 50,000, and more preferably less than 30,000. Furthermore, preferred solution-based acrylic, styrenic and styrenic-acrylic polymers have an acid number less than about 250. Preferred solution-based acrylic, styrenic and styrenic-acrylic polymers comprise monomers selected from the group: alkyl(meth)acrylate, benzyl (meth)acrylate, styrene, and alkyl-substituted styrene wherein the alkyl group is a C1 to C18 straight or branched chain alkyl group. Preferred optional monomers for these solution-based polymers include (meth) acrylic acid and hydroxyethyl(meth)acrylate.

A particularly preferred material for Layer A is a combination of the acrylic, styrenic and styrenic-acrylic latexes and water-based acrylic, styrenic and styrenic-acrylic polymers described above. Preferably the combination comprises about 20 wt % to about 80 wt %, more preferably about 40 wt % to about 80 wt %, of an acrylic or styrenic-acrylic latex fraction and about 20 wt % to about 80 wt %, more preferably about 20 wt % to about 60 wt %, of a water-based acrylic or styrenic-acrylic polymer fraction, based on the dry weight of the combination.

Other preferred dielectric polymers for Layer A include heteroatom-substituted styrenic polymers selected from the group consisting of: partially hydrogenated poly(4-hydroxy) styrene, poly(4-hydroxy)styrene (PHS), and copolymers of PHS with hydroxyethyl(meth)acrylate, alkyl (meth)acrylate, styrene, and alkyl-substituted styrene wherein the alkyl group is a C1 to C18 straight or branched chain alkyl group. Particularly preferred comonomers are hydroxyethyl methacrylate, butyl acrylate, methyl methacrylate and styrene with hydroxyethylmethacrylate and butyl acrylate being especially preferred. The PHS (co)polymers may be linear or branched. When PHS homopolymer is used, the branched structure is preferred Preferred (co)polymers of this class have a $M_w$ of less than about 30,000 and preferably less than about 20,000 and more preferably less than about 10,000. Partially hydrogenated PHS refers to PHS polymers that have been hydrogenated up to about 50 equivalent % of the unsaturation within the polymer and preferred polymers are hydrogenated to about 10 to 20 equivalent %. Commercial examples include PHS-B (branched PHS homopolymer; DuPont Electronic Technologies, Dallas, Tex.), Maruka Lyncur CMM (PHS copolymer with methyl methacrylate; Maruzen Petrochemical Co., LTD. Tokyo, Japan), Maruka Lyncur CHM (PHS copolymer with hydroxyethyl methacrylate; Maruzen), Maruka Lyncur CBA (PHS copolymer with butyl acrylate, Maruzen), Maruka Lyncur CST 15, 50, and 70 (PHS copolymers with styrene, Maruzen), and Maruka Lyncur PHM-C (partially hydrogenated PHS, Maruzen).

Other preferred dielectric polymers for Layer A include those selected from the group consisting of: phenol-aldehyde (co)polymers/(co)oligomers and combinations thereof. Preferred (co)polymers/(co)oligomers in this class are derived from mono- and bis-phenols and mono- and bis-aldehydes selected from the group consisting of: phenol; alkyl- and aryl-substituted phenols; formaldehyde; and alkyl-, aryl- and heteroatom-substituted aldehydes. The phenol-aldehyde resins can be further derivatized, e.g., the hydroxy group converted to an ether group. Preferred (co)polymers/(co)oligomers within this group have a $M_w$ of about 20,000 or less, preferably about 10,000 or less. Commercial examples include Novolac®/Novolak® resins (Schenectady International Inc., Schenectady N.Y.).

Other preferred dielectric polymers for Layer A include poly(vinyl acetate) homopolymer. Preferred polymers within this group have a $M_w$ of about 100,000 or less.

The above polymers may be plasticized for improved flexibility, adhesion, compatibilization with an IR dye, among other characteristics. In certain instances, the plasticizer may be selected from the above classes of polymers. For example, a higher Tg or higher molecular weight (MW) phenol-aldehyde polymer can be blended with a lower Tg or lower MW phenol-aldehyde polymer. Another example is PHS blended with a phenol-aldehyde polymer. Examples of suitable plasticizers for some of the above classes of polymers comprise poly(ethylene) glycol, glycerol ethoxylate, di(ethyleneglycol) dibenzoate, and phthalate-based plasticizers such as dibutyl phthalate. A number of potentially suitable plasticizers for various polymers and details regarding their use may be found in the following reference: "*Handbook of Plasticizers*," Ed. G. Wypych, ChemTec Publishing, Toronto, Ont. 2004.

Layer A comprises about 0.5 wt % to about 10 wt %, and more preferably about 0.5 wt % to about 6 wt %, based on the dry weight of Layer A, of one or more near-IR dye(s) having an absorption maximum of about 600 to about 1200 nm within the Layer A. Preferably the near-IR dye is chosen such that its absorption band overlaps with the emission band of the exposure laser used in the transfer process. Typically, the exposure laser emits radiation in the near-IR range. Preferred classes of dyes are the cyanine compound(s) selected from the group: indocyanines, phthalocyanines, including polysubstituted phthalocyanines and metal-containing phthalocyanines, and merocyanines. A particularly preferred class of near-IR dye(s) is that of indocyanine dyes, preferably having absorption at about 830 nm. A number of suitable indocyanine dyes absorbing at around 830 nm and with solubility in different solvents and in water are available from H. W. Sands Co. and other sources. Preferred near-IR dyes for the invention are selected from the group: 3H-indolium, 2-[2-[2-chloro-3-[(1,3-dihydro-1,3,3-trimethyl-2H-indol-2-ylidene) ethylidene]-1-cyclopenten-1-yl]ethenyl]-1,3,3-trimethyl-, salt with trifluoromethanesulfonic acid (1:1) having CAS No. [128433-68-1]; 2-(2-(2-chloro-3-(2-(1,3-dihydro-1,1-dimethyl-3-(4-sulphobutyl)-2H-benz[e]indol-2-ylidene)ethylidene)-1-cyclohexene-1-yl)ethenyl)-1,1-dimethyl-3-(4-sulphobutyl)-1H-benz[e]indolium, inner salt, free acid having CAS No. [162411-28-1]; and indolenine dyes corresponding to formulas (I) and (II) and resonance structures thereof.

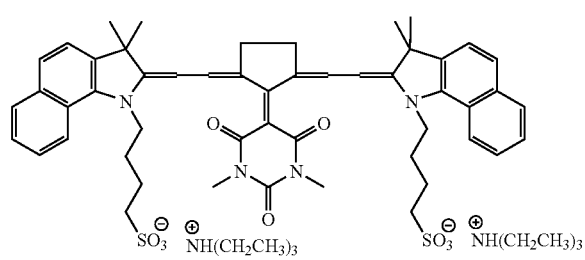

(I)

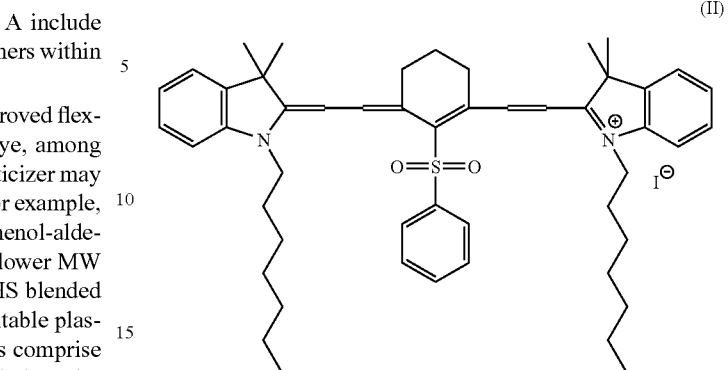

(II)

Preferred dye levels in the material will give a film OD of about 0.2 or greater, with an OD of about 0.5 to about 1.5 being preferred. To reach a preferred OD, unfilled water-based latex systems will typically require a higher dye loading of about 4 to 6 wt %. Unfilled solution-based systems will typically require lower dye loadings of about 0.5 to about 2 wt %.

In another embodiment the dielectric layer may comprise two or more Layers A that are gradient dye layers with each gradient dye layer independently characterized by a dry wt % of near-IR dye of about 0.5 to about 10 wt %; wherein at least one gradient dye layer has a lower wt % of near-IR dye, at least one gradient dye layer has a higher wt % of near-IR dye, and said higher wt % of near-IR dye is a value at least 20% higher than that of the lower wt % of near-IR dye.

In another embodiment, the Layer A can further comprise a high κ nanoparticle fraction, of about 10 to about 90 wt % based on the dry weight of Layer A, with the nanoparticle fraction having a dielectric constant greater than about 20, and an average particle size of about 5 nm to about 500 nm. Herein high κ dielectric nanoparticle fraction refers to nanoparticles with a dielectric constant of about 20 and above, preferably about 30 and above and more preferably about 100 and above. Preferred dielectric polymers for practicing this embodiment are selected from the group: acrylic and styrenic-acrylic latex, solution-based acrylic and styrenic-acrylic (co)polymers, and combinations thereof; and phenol-aldehyde (co)polymers/(co)oligomers; as described above. Preferred high κ dielectric nanoparticles for practicing this embodiment are selected from the group: barium titanate, strontium titanate, barium strontium titanate and titanium dioxide.

In another embodiment the dielectric layer can comprise two or more Layers A that are gradient nanoparticle layers with each gradient nanoparticle layer independently characterized by a dry wt % of high κ nanoparticle fraction of about 10 to about 90 wt %; wherein at least one gradient nanoparticle layer has a lower wt % of high κ nanoparticle fraction and at least one gradient nanoparticle layer has a higher wt % of high κ nanoparticle fraction, and said higher wt % of high κ nanoparticle fraction is a value at least 20% higher than that of the lower wt %.

In another embodiment the dielectric layer can further comprise an additional dielectric layer, herein referred to as Layer B, comprising one or more dielectric polymers, characterized by a resistivity of about $10^{14}$ ohm-cm or greater. Extensive lists of dielectric polymers can be found in WO 03/052841 and WO 06/024012. Preferred dielectric polymers for Layer B are selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl(meth)acrylate, styrene, and alkyl-substituted styrene wherein the alkyl group is a C1 to C18 straight or branched chain alkyl group; phenol-aldehyde (co)polymers and (co)oligomers and combinations thereof; and poly (vinyl acetate), as described above. This embodiment can be further practiced including other embodiments disclosed above. Preferred optional additives for Layer B include carbon black and high κ nanoparticles with preferred high κ dielectric nanoparticles for practicing this embodiment selected from the group consisting of: barium titanate, strontium titanate, barium strontium titanate and titanium dioxide.

Another material useful in fabricating the TFTs is a dielectric layer having a resistivity of $10^{14}$ ohm-cm or greater and comprising at least one layer of material, herein referred to as Layer C, comprising one or more dielectric polymer(s) selected from the group consisting of: acrylic, styrenic and styrenic-acrylic latex; comprising at least about 85 wt % of monomers selected from the group consisting of: alkyl(meth) acrylate, styrene, and alkyl-substituted styrene wherein the alkyl group is a C1 to C18 straight or branched chain alkyl group. This embodiment can be further practiced including other embodiments disclosed above. In one embodiment Layer C further comprises a high κ nanoparticle fraction, up to about 90 wt % of the dry weight of Layer C, with the nanoparticle fraction having a dielectric constant greater than about 20, and an average particle size of about 5 nm to about 500 nm. Preferred optional additives for Layer C include carbon black and high κ dielectric nanoparticles with preferred high κ dielectric nanoparticles for practicing this embodiment selected from the group: barium titanate, strontium titanate, barium strontium titanate and titanium dioxide.

The Tg's of the dielectric polymers utilized in Layer A, Layer B and Layer C range from about −30 to about 150° C., preferably about 20 to about 90° C. and most preferably about 30 to about 70° C. Typically, the addition of fillers enables the utilization of lower Tg polymers and the addition of plasticizers enables the utilization of higher Tg polymers. The preferred Tg of the dielectric layer itself and of the layers utilized in the dielectric layer, including Layer A, Layer B, and Layer C is about 30 to about 100° C., preferably about 40 to about 85° C. and most preferably about 45 to about 65° C.

Layer A, Layer B and Layer C may include additives such as fillers, surfactants, defoamers, dispersants and grinding aids. Numerous surfactants, defoamers, dispersants and grinding aids are available that are suitable for this purpose. Selection will often be based upon observed coating and dispersion quality and the desired adhesion of the dielectric layer to other layers in the thermal transfer process. In certain embodiments, the surfactants comprise siloxy-, fluoryl-, alkyl- and alkynyl-substituted surfactants. These include the Byk® (Byk Chemie), Zonyl® (DuPont), Triton® (Dow), Surfynol® (Air Products) and Dynol® (Air Products) surfactants. Preferred surfactants are Byk® 345, 346 and 348 and Zonyl® FSO and FSN. In certain embodiments, the defoamers comprise alkyl and alkynyl functionality and include Surfynol® defoamers. In certain embodiments, the disperants comprise functionalized polymers, oligomers and monomers and include Surfynol® and Disperbyk® dispersants.

The preferred thickness of the dielectric layer and of the layers utilized in the dielectric layer, including Layer A, Layer B and Layer C, is about 0.05 to about 10 microns, preferably about 0.1 to about 5 microns, and more preferably about 0.2 to about 3 microns.

Thermal Imaging Dielectric Donors

The TFTs and other electronic devices can be made using a multilayer thermal imaging dielectric donor and the thermal transfer process as disclosed herein. The multilayer thermal imaging dielectric donor comprises: a base film; and a dielectric transfer layer comprising at least one Layer A or Layer C described above, wherein the dielectric transfer layer is characterized by a resistivity of $10^{14}$ ohm-cm or greater. In various forms the thermal imaging donor may include: an LTHC layer interposed between the base film and the dielectric transfer layer; an interlayer interposed between the base film and the dielectric transfer layer; and an interlayer interposed between an LTHC layer and the dielectric transfer layer. In another embodiment, the dielectric transfer layer may further comprise one or more additional dielectric layer(s) comprising Layer B as described above. The additional dielectric layer(s) may be below and/or on top of the dielectric transfer layer.

The thermal imaging donor may optionally include other layers known in the art, for example, an antistatic layer may be present adjacent the base film and opposite the transfer layer; a primer layer, ejection layer, and/or an underlayer may be disposed between the base film and the LTHC layer; and an adhesive layer may be disposed adjacent the dielectric transfer layer opposite the base film. Thus, the thermal transfer donor can include an interlayer, primer layer, release layer, ejection layer, thermal insulating layer, underlayer, adhesive layer, humectant layer, and light attenuating layer.

FIG. 1A is a cross-sectional view of thermal imaging donor 100, useful in some embodiments of the invention. Thermal imaging donor 100 comprises a dielectric transfer layer 106 and a base film 102 that provides support to the other layers of thermal imaging donor 100. Base film 102 comprises a flexible polymer film and is preferably transparent. A suitable thickness for base film 102 is about 25 μm to about 200 μm, although thicker or thinner support layers may be used. The base film may be stretched by standard processes known in the art for producing oriented films and one or more other layers, such as the LTHC layer, may be coated onto the base film prior to completion of the stretching process. Preferred base films are selected from the group consisting of: polyethylene terephthalate (PET), triacetyl cellulose, polyethylene naphthalate (PEN), and polyimide with PET being especially preferred.

Light to Heat Conversion Layer (LTHC)

Figure 1B:
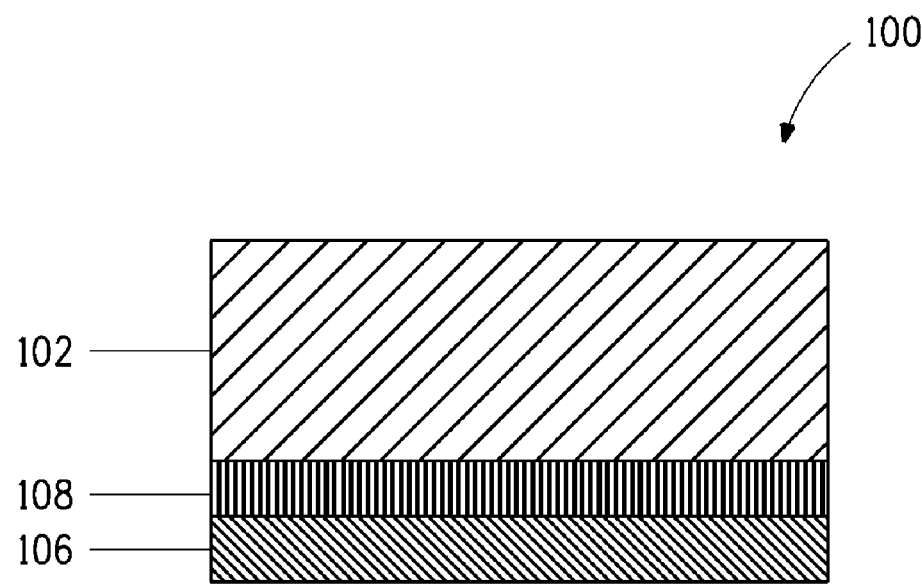

The thermal imaging donor may have a LTHC layer 108, interposed between the base film and the dielectric transfer layer 106 as illustrated in FIG. 1B. The LTHC layer 108 is for radiation-induced thermal transfer, to couple the energy of light radiated from a light-emitting source into the thermal transfer donor. Typically, a radiation absorber in the LTHC layer (or other layers) absorbs light in the infrared, visible, and/or ultraviolet regions of the electromagnetic spectrum and converts the absorbed light into heat. The radiation absorber is typically highly absorptive, providing an optical density (OD) at the wavelength of the imaging radiation of 0.1 to 3 or higher, and preferably from 0.2 to 2. Suitable radiation absorbing materials can include, for example, dyes, pigments, metals, metal compounds, metal films, and other suitable absorbing materials. Suitable radiation absorbers and binders for LTHC layers are well-known in the art and extensive lists and references can be found in PCT/US05/38010; PCT/US05/38009; U.S. Pat. No. 6,228,555 B1; Matsuoka, M., "*Infrared Absorbing Materials*", Plenum Press, New York, 1990; and Matsuoka, M., *Absorption Spectra of Dyes for Diode Lasers*, Bunshin Publishing Co., Tokyo, 1990; which are herein incorporated by reference. Metal radiation absorbers also may be used as LTHC layers, either in the form of particles or as films, as disclosed in U.S. Pat. No. 5,256,506 hereby incorporated by reference. Nickel and chromium are preferred metals for the LTHC layer 108, with chromium being especially preferred. Any other suitable metal for the heating layer can be used.

A preferred LTHC layer comprises one or more water-soluble or water-dispersible radiation-absorbing cyanine compound(s) selected from the group consisting of: indocyanines, phthalocyanines including polysubstituted phthalocyanines and metal-containing phthalocyanines, and merocyanines; and one or more water-soluble or water-dispersible polymeric binders selected from the group consisting of: acrylic resins, hydrophilic polyesters, sulphonated polyesters, and maleic anhydride homopolymers and copolymers.

Figure 2A:
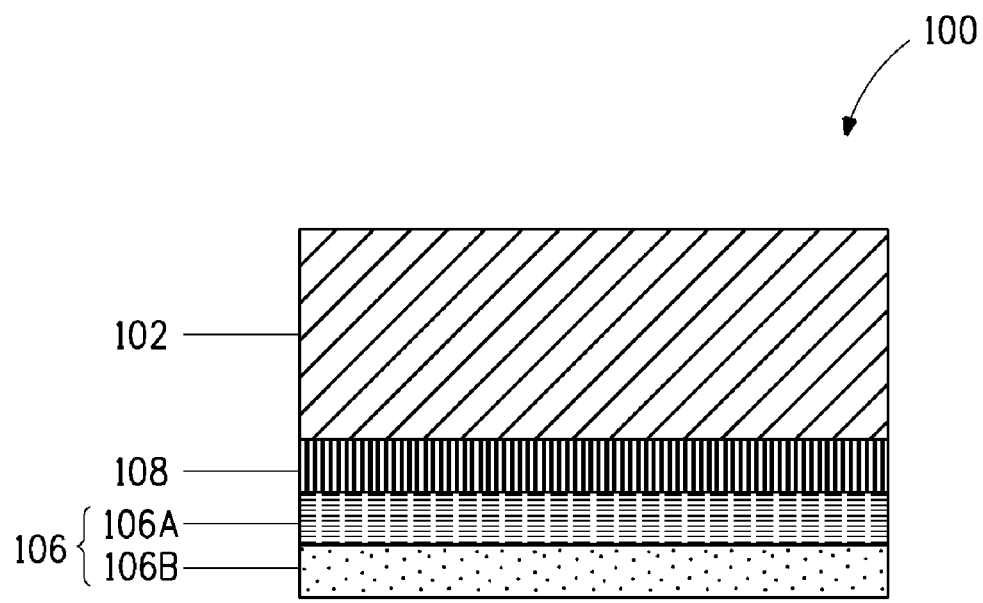
FIG. 2A is a cross-sectional view of a thermal imaging dielectric donor having gradient dyes layers useful in some embodiments of the invention in forming TFTs.

A preferred donor useful in various embodiments is wherein the dielectric transfer layer comprises two or more Layers A that are gradient dye layers as described above. FIG. 2A illustrates this embodiment, wherein dielectric layers 106A and 106 B are gradient dye layers.

Figure 2B:
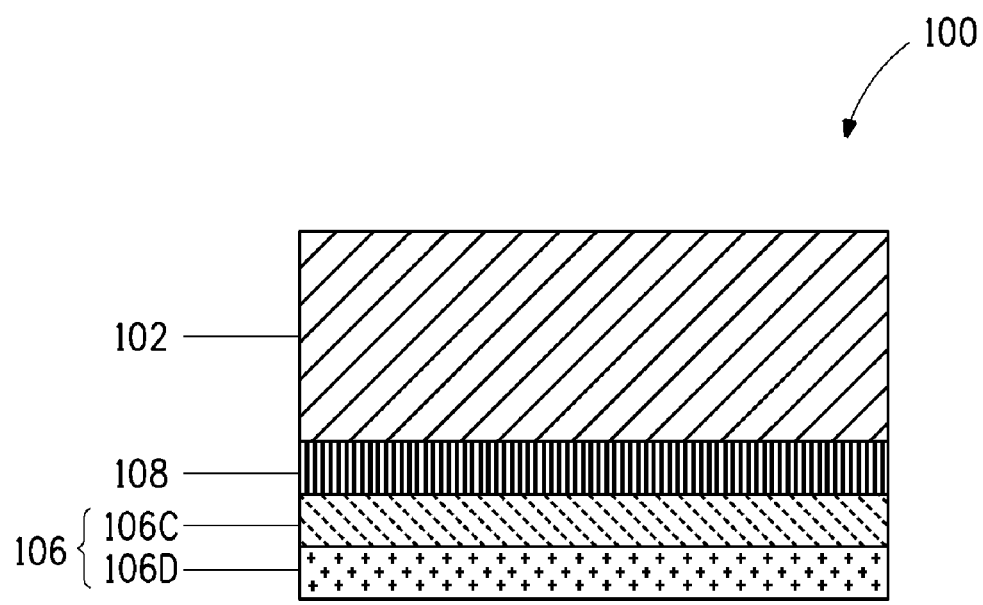
FIG. 2B is a cross-sectional view of a thermal imaging dielectric donor having gradient nanoparticle layers useful in some embodiments of the invention in forming TFTs.

Another preferred donor useful in various embodiments, is wherein the dielectric transfer layer comprises two or more Layers A that are gradient nanoparticle layers, as described above. FIG. 2B illustrates this embodiment, wherein dielectric layers 106C and 106D, are each gradient nanoparticle layers.

Another preferred donor useful in various embodiments is wherein the dielectric transfer layer comprises two or more layers of material that are gradient layers with respect to both near-IR dye loading and high κ nanoparticle fraction, within the limits described above.

Another preferred donor, useful in various embodiments, includes a dielectric transfer layer comprising one or more Layer(s) A and one or more Layer(s) B.

The multilayer thermal imaging dielectric donor(s) can be prepared by dispersing and/or dissolving the dielectric polymer(s), near-IR dye(s) and, optionally, the high κ nanoparticle fraction, in a suitable volatile carrier fluid to provide a solution or suspension; and coating the solution or suspension onto a suitable substrate and removing the carrier fluid. Typically the volatile carrier fluid is water, an organic solvent, a gaseous material, or some combination thereof, and is chosen to be compatible with the various components of the composition. Examples include water, lower alcohols such as ethanol, aliphatic and aromatic hydrocarbons such as hexane, cyclohexane and xylenes; ethers such as dibutyl ether; ether alcohols such as 2-methoxyethanol; esters such as butyl acetate; and aliphatic and aromatic halocarbons such as 1,2-dichloroethane. Lower molecular weight oligomers and small molecules useful as processing aids, including the dispersants and surfactants listed above, may be present in the compositions. Applying the solution or suspension can be accomplished by any method that gives a uniform layer, or if desired, a patterned or non-uniform layer. Coating, including rod-coating, extrusion coating, gravure coating and spin-coating, spraying, printing, blading or knifing can be used. Coating and spraying are preferred methods. Many commercial coating machines, devices such as a coating rod and knife blade, and printing machines can be used to apply the solution or suspension. The carrier fluid is allowed to evaporate to provide the dielectric layer. The dielectric layer can be dried by any conventional method of drying including applying heat and vacuum.

Metal Compositions

Another material useful in fabricating TFTs and other electronic devices using the invention is a metal composition (A) comprising:

(1) about 65 to about 95 wt %, based on the total weight of the metal composition, of a metal powder selected from the group: Ag, Cu and alloys thereof; comprising a plurality of metal particles having an average longest dimension of about 5 nm to about 1500 nm; and (2) about 5 to about 35 wt % of a dispersant comprising one or more resins selected from the group consisting of: conducting polymers selected from the group consisting of: polyaniline, polythiophene, polypyrrole, polyheteroaromatic vinylenes, and their derivatives; and nonconducting polymers selected from the group consisting of: acrylic and styrenic-acrylic latexes, and solution-based acrylics and styrenic-acrylic (co)polymers, and combinations thereof; copolymers of ethylene with one or more monomers selected from the group consisting of: (meth)acrylate(s), vinyl acetate, carbon monoxide and (meth)acrylic acid; polyvinylacetate and its copolymers.

Preferably the metal composition (A) comprises about 85 to about 95 wt % metal powder, and preferably with an average particle size of between 100 nm and about 400 nm. In one preferred embodiment the metal powder is silver metal flake, with an average equivalent spherical diameter of about 100 to about 900 nm. In various aspects of the invention the metal composition (A) comprises 96 wt % or greater, and preferably 98 wt % or greater, of components (1) and (2) as stated above. The metal composition (A), relative to conventional compositions, has a high loading of metal particles and provides conducting layers without the need for firing or burning-off of polymer binders.

Silver is a preferred metal powder for the compositions. The metal powders are readily available from several commercial sources including: Ferro Corp., Electronic Materials Systems, South Plainfield, N.J.; Nanostructured & Amorphous Materials, Houston, Tex.; Inframat® Advanced Materials, Farmington, Conn.; Sumitomo Metal Mining Co., Ltd., Tokyo, Japan; and Mitsui Mining and Smelting Co., Ltd., Tokyo, Japan.

"Dispersant" refers to non-volatile organic or inorganic material that is used as a carrier or matrix medium in the metal composition (A). The dispersant includes one or more of the following components: polymers, oligomers, surface treatments, plasticizers, processing aids such as defoamers, surfactants, stabilizers, coating aids, pigments, dyes including near infrared dyes, and the like. The dispersant has several functions including: allowing the dispersion of the metal particles so they are evenly distributed and applied as conducting layers; and contributing to the transfer properties, most notably the relative adhesion of the metal transfer layers to the donor element and the thermal imaging receiver in the thermal transfer process. The dispersant also may contribute to the functional properties of the transfer layers. For instance, the dispersant may be a conducting polymer.

The properties of the dispersant refer to the bulk properties of the fully formulated dispersant formulations, unless specifically noted. Preferred dispersants are polymers having a Tg of about −30° C. to about 90° C., and more preferably, about 30° C. to about 70° C.

Polymers useful as dispersants in metal composition (A) include conducting organic polymers and doped versions of these polymers, e.g., polyaniline, polythiophene, polypyrrole, polyheteroaromatic vinylene, polyfuran, poly(para-phenylene), poly(phenylenevinylene), polyisothianaphthene, polyparaphenylene sulphide, and their derivatives. Preferred derivatives fall in one or more of the following categories: (a) stable conducting polymers such as polyaniline (PANI) and polyethylene dioxythiophene (PEDOT); (b) soluble or dispersible conducting polymers that form films using standard coating techniques, including PANI, PEDOT; and other alkyl- or alkoxy-substituted derivatives of conducting polymers such as poly(2,5 dialkoxy)paraphenylene vinylene and poly(3-hexyl)thiophene; and (c) conducting polymers that give high conductivity upon doping. Preferred conducting polymers are selected from the group consisting of: polyaniline; polythiophene; polypyrrole; polyheteroaromatic vinylenes; and their derivatives; preferably at a level of 1 to about 5 wt % based on the dry weight of metal composition (A).

Further polymers useful as dispersants in metal composition (A) are those defined earlier for dielectric layers, including Layer A and Layer B. Preferred are polymers selected from the group consisting of: acrylic and styrenic-acrylic latexes and solution-based acrylic and styrenic-acrylic (co) polymers including random and graft copolymers; and combinations thereof; copolymers of ethylene with one or more monomers selected from the group consisting of: (meth)acrylates, vinyl acetate, carbon monoxide and (meth)acrylic acid; polyvinylacetate and its copolymers; and polyvinylpyrrolidone and its copolymers including polyvinylpyrrolidone-co-vinyl acetate. Preferably the solvent-soluble polymers within the group are characterized by a $M_w$ of about 10,000 to about 200,000.

The dispersant may comprise up to about 10 wt %, based on the total weight of the dispersant, of one or more resin additives selected from the group of: pigments, dyes and conducting particles selected from the group: carbon black, carbon nanotubes, and modifying metal and metal alloy powders. Preferred modifying metals are Au and Pd. A preferred composition comprises 0.5 wt % to about 10 wt %, based on the total weight of the dispersant, of the conducting additive with an average particle size greater than 5 nm and less than about 1500 nm. The most preferred conducting additives are carbon black and carbon nanotubes.

Low molecular weight oligomers and small molecules useful as processing aids in the dispersant include surfactants, for instance, those comprising siloxy-, fluoryl-, alkyl- and alkynyl-substituted surfactants. These include the Byk® (Byk Chemie), Zonyl® (DuPont), Triton® (Dow) Surfynol® (Air Products) and Dynol® (Air Products) surfactants. Preferred surfactants are Triton® X-114, Disperbyk® 163, Byk® 345, 346 and 348 and Zonyl® FSA, FSO and FSN.

The metal composition (A) is typically prepared by mixing metal powder and the dispersant with a volatile carrier fluid to provide a fluid dispersion. Typically the volatile carrier fluid is water, an organic solvent, a gaseous material, or some combination thereof. The volatile carrier fluid is chosen to be compatible with the metal particles and any optional dispersant that is used. Examples of volatile carrier fluids include water, lower alcohols such as ethanol, aliphatic and aromatic hydrocarbons such as hexane, cyclohexane and xylenes; ethers such as dibutyl ether; ether alcohols such as 2-methoxyethanol; esters such as butyl acetate; and aliphatic and aromatic halocarbons such as 1,2-dichloroethane.

Thermal imaging metal donors are useful in making TFTs and other electronic devices. In various embodiments the thermal imaging metal donor comprises, in layered sequence, a base film, an optional LTHC layer, a metal transfer layer comprising the metal composition (A) and an optional protective strippable cover layer. Other embodiments can include one or more additional transfer layers interposed between the base film and the metal transfer layer and/or on top of the metal transfer layer. One or more other conventional thermal transfer donor element layers can be included in the thermal imaging metal donor useful in the present invention, including but not limited to an interlayer, primer layer, release layer, ejection layer, thermal insulating layer, underlayer, adhesive layer, humectant layer, and light attenuating layer.

Figure 3A:
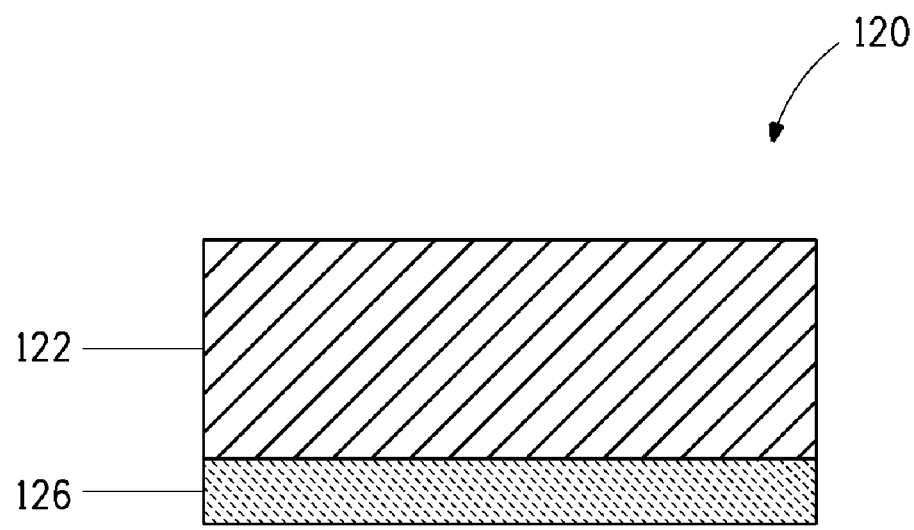
FIGS. 3A and 3B are cross-sectional views of thermal imaging metal donors useful in some embodiments of the invention in forming TFTs.
Figure 3B:
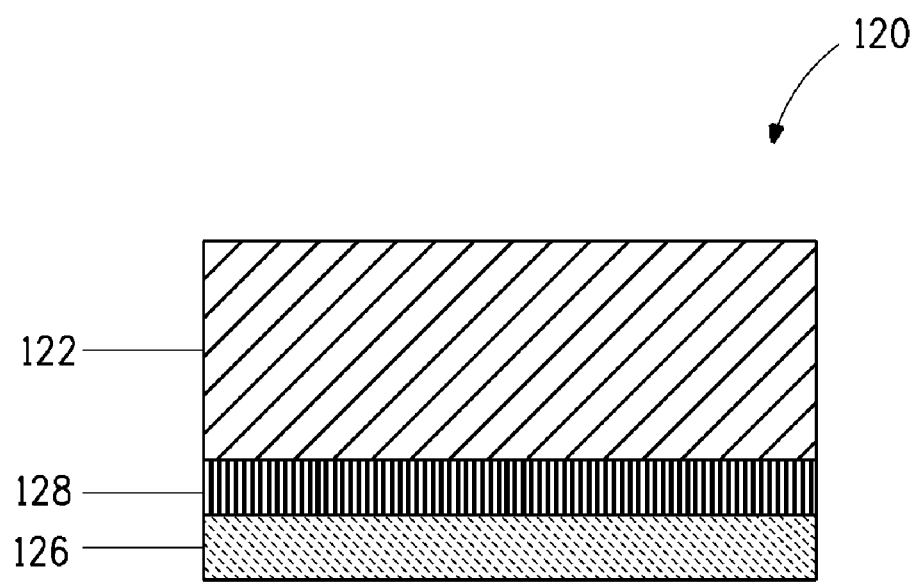

FIG. 3A is a cross-sectional view of thermal imaging metal donor 120, useful in preparing TFTs, comprising a base film 122 and a metal transfer layer 126 comprising the metal composition (A) dispersed on the surface of the base film. Base film 122 can be the same as described above. The thermal imaging metal donor may have a LTHC layer 128, as described above, interposed between the base film and the metal transfer layer 126, as illustrated in FIG. 3B. The thermal imaging metal donor(s) can be prepared by methods similar to those described for the dielectric donors, using the metal composition (A) fluid dispersion described above.

Semiconductors

The patterned semiconductor layer useful in fabricating TFTs using the invention can include a variety of semiconductor materials. Suitable semiconductors include pentacene, sexithiophene, tetracene, polythieneylenevinylene, thiophene oligomers, benzothiophene dimers, and polyacetylenes. A preferred semiconductor layer for the various embodiments of the invention is selected from the group consisting of: pentacene, compound SC-H1 and compound SC-H2:

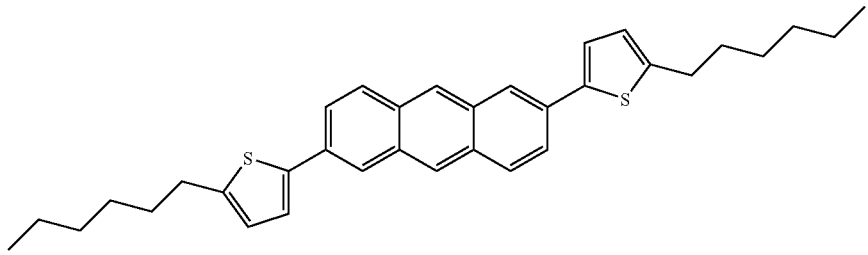

Compound SC-H1

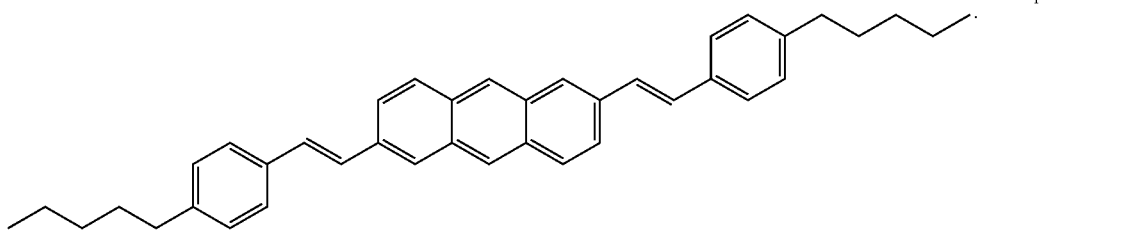
Compound SC-H2

The semiconductor layer can be deposited by vapor deposition using a mask or by printing.

Thermal Transfer Processing

The thermal imaging donors comprising dielectric transfer layers or metal transfer layers described above are useful in formation of TFTs using a dry thermal transfer process. To use a thermal imaging donor, the donor is contacted with a thermal imaging receiver. By contacted is meant that the donor is in close proximity, preferably within several microns, of the thermal imaging receiver. The receiver may be off-set from the donor by, for example, previously printed layers, fibers or particles that act as spacers to provide a controlled gap between donor and receiver. Vacuum and/or pressure can be used to hold the donor element 100 or 120 and the receiver element 200 together. As one alternative, the donor element 100 or 120 and the receiver element 200 can be held together by fusion of layers at the periphery of the assembly.

In transferring metal layers or dielectric layers, at least a portion of the metal or dielectric transfer layer, and optionally, a portion of one or more additional transfer layers, is transferred to the thermal imaging receiver by thermal transfer to form a patterned layer. Thermal transfer can be achieved by a laser-mediated transfer process. In one embodiment, the assembly of the donor element 100 or 120 and the receiver element 200 is selectively exposed to heat, which is preferably in the form of laser radiation, in an exposure pattern of the image of the desired pattern to be formed on the receiver element. The laser radiation is focused about at the interface between those layers to be transferred and those to remain with the donor. For instance, if an LTHC layer is present the laser is focused at the LTHC layer. Sufficient radiation is applied to achieve transfer of the desired transfer layers to the receiver.

A variety of light-emitting sources can be used to heat the thermal transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Other light sources and irradiation conditions can be suitable based on, among other things, the donor element construction, the transfer layer material, the mode of thermal transfer, and other such factors.

The radiation is preferably applied through the backside of base film 102 or 122, that is, the side not containing the transfer layer. Laser radiation is preferably provided at a laser fluence of up to about 600 mJ/cm$^2$, more preferably about 75-440 mJ/cm$^2$. Various types of lasers can be used. The laser preferably emits in the infrared, near-infrared or visible region. Particularly advantageous are diode lasers emitting in the region of 750 to 870 nm which offer a substantial advantage in terms of their small size, low cost, stability, reliability, ruggedness and ease of modulation. Diode lasers emitting in the range of 780 to 850 nm are most preferred. Such lasers are available from, for example, Spectra Diode Laboratories (San Jose, Calif.). Other types of lasers and lasers, which emit in other wavelength bands, may be used as well. One device used for applying an image to the receiver is the Creo Spectrum Trendsetter 3244F, which utilizes lasers emitting near 830 nm. This device utilizes a Spatial Light Modulator to split and modulate the 5-50 Watt output from the ~830 nm laser diode array. Associated optics focus this light onto the imageable elements. This produces 0.1 to 30 Watts of imaging light on the donor element, focused to an array of 50 to 240 individual beams, each with 10-200 mW of light in approximately 10×10 to 2×10 micron spots. Similar exposure can be obtained with individual lasers per spot, such as disclosed in U.S. Pat. No. 4,743,091. In this case each laser emits 50-300 mW of electrically modulated light at 780-870 nm. Other options include fiber-coupled lasers emitting 500-3000 mW and each individually modulated and focused on the media. Such a laser can be obtained from Opto Power in Tucson, Ariz.

Figure 4A:
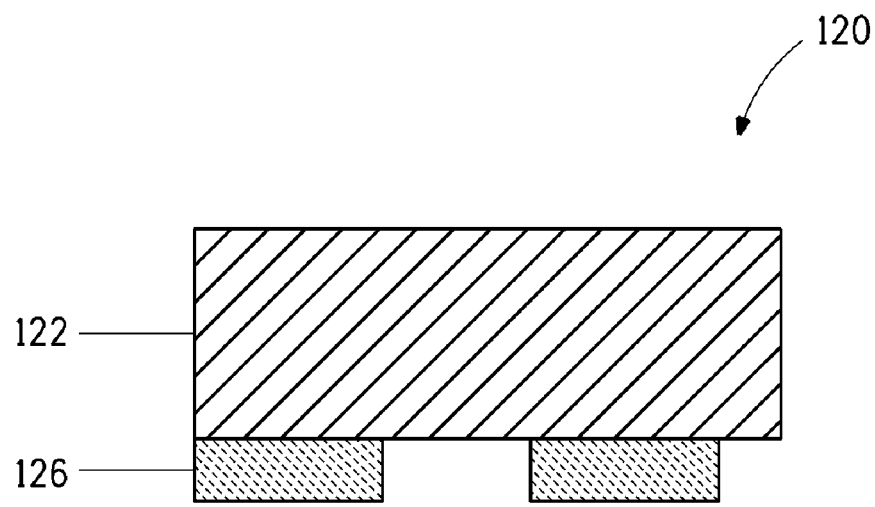
FIGS. 4A and 4B are cross-sectional views of the untransferred portions of a patterned metal donor element 120 and transferred portions of the patterned metal transfer layer on a receiver element 200, respectively.
Figure 4B:
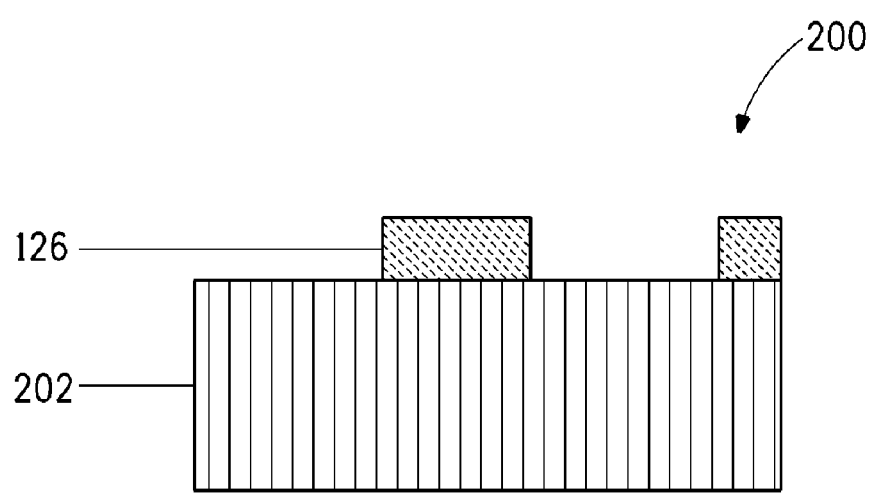

After exposure, the donor element 120, for instance, and the receiver element 200 are separated, as illustrated in FIGS. 4A and 4B, leaving the untransferred portions of the patterned metal transfer layer 126 on the donor element 120 and the transferred portions of the patterned metal transfer layer 126 on the receiver element 200.

Figure 5A:
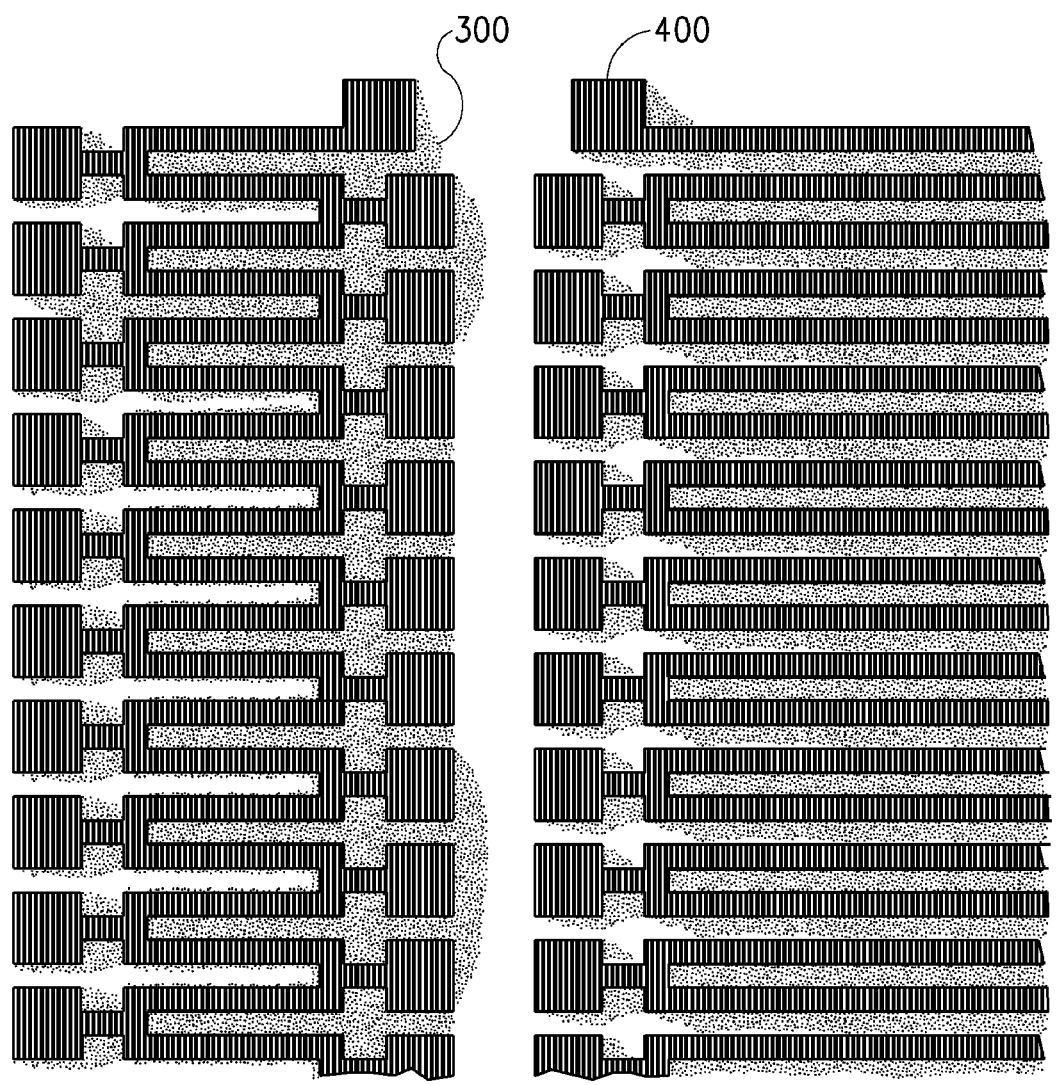
FIG. 5A is a photomicrograph at 5× magnification of an untreated imaged thermal transfer receiver with 50 micron serpentine line pattern.

In some instances, depending upon the nature of the donor and receiver elements and the transfer processing parameters, when the donor element and the receiver element are separated after thermal transfer, the receiver element includes both exposed portions and some non-exposed portions of one or more transfer layers. FIG. 5A is a photomicrograph at 5× magnification of an untreated imaged thermal transfer receiver with a 50 micron serpentine line pattern of Example 10. Two issues are noteworthy: narrow gaps between lines still show the presence of non-exposed material; and, many line edges are rough due to fragments of non-exposed debris. In FIG. 5A, non-exposed portions (300) are represented by grey areas in FIG. 5A and the exposed portions (400) are represented by the black areas. The process of the invention, as herein disclosed, improves the thermally transferred pattern on a thermal transfer receiver by removal of the non-exposed portions of various transferred transfer layers, using a dry process; that is, without the use of solvents.

Thus, one embodiment of the invention is a process for enhancing the resolution of a thermally transferred pattern on a thermal transfer receiver, wherein the imaged thermal transfer receiver comprises a surface having an exposed portion and a non-exposed portion of one or more thermally transferred layers, comprising: (a) contacting said surface with an adhesive layer for a contact period to provide a laminate; (b) separating said adhesive layer from the laminate to provide a treated thermal transfer receiver having a surface substantially free of said non-exposed portion of one or more thermally transferred layers.

Figure 5B:
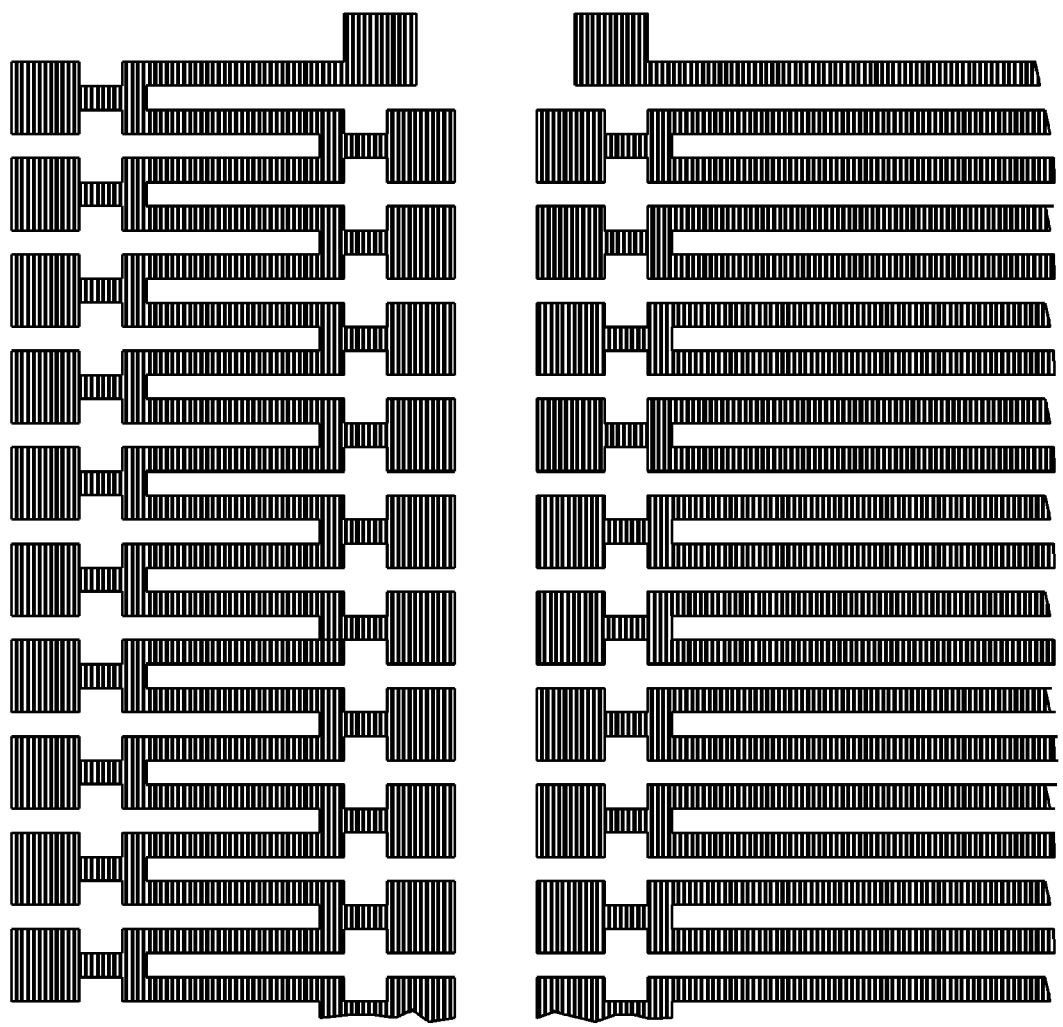
FIG. 5B is a photomicrograph at 5× magnification of a treated imaged thermal transfer receiver that shows the 50 micron serpentine line pattern after treatment with an adhesive layer according to one embodiment of the invention.

FIG. 5B is a photomicrograph at 5× magnification of a treated imaged thermal transfer receiver that shows the same 50 micron serpentine line pattern of Example 10, after treatment with an adhesive layer according to the process of the invention. Two improvements are noteworthy: non-exposed portions of transfer layers in the narrow gaps between lines have been removed; and the fragments of non-exposed debris from the rough line edges have been removed to provide clean line edges.

Non-exposed portions of one or more thermally transferred layers can be in the form of peel defects, defined herein as non-exposed portions of an imaged layer that are transferred onto the receiver along with the exposed portion of the layer. These peel defects are typically relatively weakly adhered to the receiver as compared to the exposed portions of the image. Minimization and absence of these peel defects can be achieved by optimization of donor formulations, tuning of donor drying times and temperatures, control of the temperature and relative humidity of the printing room, and by selection of the receiver and tuning of its surface through various surface treatments. The peel defects can often be selectively removed by brief contact with an adhesive surface. Contact periods are about from 0.01 seconds to minutes, preferably 1 second to 10 minutes, more preferably 1-90 seconds.

In one embodiment the adhesive layer can comprise a polymer base film. Preferred base films comprise a polymeric material selected from the group consisting of: poly(vinyl chloride), poly(ethylene), poly(propylene), poly(carbonate), polyethylene terephthalate, triacetyl cellulose, polyethylene naphthalate, and polyimide, with PET being especially preferred. Preferred adhesive layers include polymer- and metal-coated base films. In one embodiment the adhesive layer is in the form of a metallized film, similar to the LTHC layer described above, comprising a base film and a metallized layer as the adhesive element. Any suitable metal can be used for the metallized layer including: Sc, Y, La, Ti, Zr, Hf, V, Nb, Ta, Cr, Mo, W, Mn, Fe, Ru, Co, Ni, Pd, Cu, Ag, Au, Zn, Al, Ga, In, Ge, Sn, Sb, and Bi; and alloys thereof. Preferred metallized layers comprise metals selected from the group consisting of: Ti, Zr, V, Nb, Cr, Mo, W, Mn, Fe, Co, Ni, Cu, Ag, and Al, and alloys thereof. The preferred thickness of the metallized layer is about 40 to about 200 Angstroms, and more preferred is about 80 to about 100 Angstroms.

Another preferred adhesive layer comprises a base film, as described above, and an adhesive dielectric layer comprising one or more dielectric polymer(s). Preferably the adhesive dielectric layer comprises one or more dielectric polymer(s) selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl(meth)acrylate, alkyl(meth)acrylate, styrene, and alkyl-substituted styrene wherein the alkyl group is a C1 to C18 straight or branched chain alkyl group; phenol-aldehyde (co)polymers and (co) oligomers and combinations thereof; and poly(vinyl acetate). In one embodiment the adhesive dielectric layer comprises acrylic and styrenic polymers selected from the group consisting of: acrylic, styrenic and styrenic-acrylic latexes, solution-based acrylic, styrenic and styrenic-acrylic polymers, and combinations thereof. Another embodiment is wherein the one or more dielectric polymer(s) is selected from the group consisting of: acrylic, styrenic and styrenic-acrylic latexes; comprising at least about 85 wt % of monomers selected from the group consisting of: alkyl (meth)acrylate, styrene, and alkyl-substituted styrene wherein the alkyl group is a C1 to C18 straight or branched chain alkyl group.

Commercial examples of adhesive layers are Scotch® tape (3M Company), and a tacky roller such as a medium tack Dust Removal System-1 roller (Systems Division, Inc., Irvine Calif.).

Additionally, the adhesive layer may contain one or more near-IR dye(s) having an absorption maximum of about 600 to about 1200 nm within the adhesive layer, as disclosed above in discussion of Layer A. Such an adhesive layer, comprising the near-IR dye(s), can be exposed with radiation, preferably from a laser, to control the temperature and tackiness of the layer.

In removing peel defects from particle-containing layers with high particle loading, such as metal nanoparticle layers and pigmented layers, e.g., such layers with greater than 20 wt % particles, more preferably greater than 30 wt % particles, and most preferably greater than 50 wt % particles, stronger adhesive surfaces such as Scotch® tape or a tacky roller are often useful. In removing peel defects from unfilled or lightly filled layers, such as polymer-based dielectric layers or conducting polymer layers, such as polyaniline-based conductor layers, weaker adhesive surfaces such as the acrylic latex donor and receiver surfaces disclosed herein or metallized layer surfaces are often useful.

Contact between the adhesive layer and the receiver surface can be achieved by placing the receiver on a flat surface or leaving it on the thermal printing machine and contacting the patterned receiver surface with the adhesive layer by rolling a tacky roller over the side of the adhesive layer opposite the receiver with light pressure. Alternatively, the patterned receiver can be left on the printing machine and contact with the surface of the adhesive layer can be established by vacuum. The adhesive layer containing the removed peel defects can then be separated from the imaged thermal transfer receiver. If desired, additional layers can be subsequently printed.

The term "having a surface substantially free of said non-exposed portion of one or more thermally transferred layers" means that greater than about 80%, preferably greater than 90% and most preferably greater than 98%, of the non-exposed portion has been removed from the patterned receiver as estimated by comparison of surfaces with microscopy.

In one embodiment, the one or more thermally transferred layers, on the receiver surface, comprises nanoparticles that are characterized by an average longest dimension of about 5 nm to about 1500 nm. The nanoparticles may be any of those disclosed above in the section entitled "nanoparticles." In a preferred embodiment the nanoparticles comprise a metal powder, and preferably the metal powder is selected from the group consisting of: Ag, Cu, and alloys thereof.

In one embodiment, the one or more thermally transferred layer(s), on the receiver surface, comprises a conducting polymer, as disclosed in the section below entitled "Thin Film Transistors." In another embodiment the one or more thermally transferred layers comprises one or more conducting polymers selected from the group consisting of: polyaniline; polythiophene; polypyrrole; polyheteroaromatic vinylenes; and their derivatives; and more preferably, the conducting polymer is polyaniline.

In one embodiment, the one or more thermally transferred layer(s) comprises one or more dielectric polymer(s). In another embodiment the one or more thermally transferred layers comprises the one or more dielectric polymer(s) selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl(meth)acrylate, alkyl(meth)acrylate, styrene, and alkyl-substituted styrene wherein the alkyl group is a C1 to C18 straight or branched chain alkyl group; phenol-aldehyde (co)polymers and (co) oligomers and combinations thereof; and poly(vinyl acetate). In another embodiment the one or more thermally transferred layer(s) comprises one or more dielectric polymer(s) selected from the group consisting of: acrylic and styrenic polymers selected from the group consisting of: acrylic, styrenic and styrenic-acrylic latexes, solution-based acrylic, styrenic and styrenic-acrylic polymers, and combinations thereof. In another embodiment the one or more thermally transferred layer(s) comprises one or more dielectric polymer(s) selected from the group consisting of: acrylic, styrenic and styrenic-acrylic latex; comprising at least about 85 wt % of monomers selected from the group consisting of: alkyl(meth)acrylate, styrene, and alkyl-substituted styrene wherein the alkyl group is a C1 to C18 straight or branched chain alkyl group.

In one embodiment, the one or more thermally transferred layers comprise a pigment. Preferred pigments include black pigments, including graphite, carbon black and metal oxides, including oxides of copper, copper-cobalt alloy and ruthenium; colored pigments, including cyanine-, phthalocyanine-, azo-, pyrrolidone-, and quinonacridine-based pigments such as Pigment Green 7, Pigment Green 36, Pigment Blue 15:16, Pigment Yellow 150, Pigment Yellow 83, Pigment Violet 19, and Pigment Red 254; and white pigments, including titanium dioxide and higher κ pigments such as barium titanate, strontium titanate, and barium strontium titanate.

Thin Film Transistors

A TFT generally includes a gate electrode, a dielectric layer on the gate electrode, a source electrode and a drain electrode adjacent to the dielectric layer, and a semiconductor layer adjacent to the dielectric layer and adjacent to the source and drain electrodes. For general reference see, for example, S. M. Sze, in Physics of Semiconductor Devices, $2^{nd}$ edition, John Wiley & Sons, New York (1981) page 492. These components can be assembled in a variety of configurations. These elements are typically mounted on an inert substrate during manufacturing, testing and/or use. Optionally, the substrate can provide an electrical function for the TFT.

Useful substrate materials include organic and inorganic materials. A preferred substrate for the TFT of the embodiments is selected from the group consisting of: polyethylene terephthalate, polyethylene naphthalate, triacetyl cellulose, glass and polyimide.

In certain embodiments the thin film electrodes (i.e., the gate, source, and drain electrodes) can be any useful conductive material. For example, the gate electrode can comprise doped silicon or a metal (e.g., aluminum, chromium, gold, silver, nickel, palladium, platinum, tantalum, or titanium). Conductive polymers also can be used, for example polyaniline or poly(3,4-ethylenedioxythiophene)/poly(styrene sulfonate) (PEDOT:PSS). In addition, alloys, combinations, and multilayers of these materials can be used. In some TFTs, a single material can function as the gate electrode and the substrate. For example, doped silicon can function as the gate electrode and also support the TFT.

The dielectric layer generally covers the gate electrode. The dielectric layer electrically insulates the gate electrode from the balance of the TFT device. Useful materials for the dielectric layer, other than those specifically defined above, can comprise any inorganic electrically insulating material, e.g., strontiates, tantalates, titanates, zirconates, aluminum oxides, silicon oxides, tantalum oxides, titanium oxides, silicon nitrides, barium titanate, barium strontium titanate, barium zirconate titanate, zinc selenide, or zinc sulfide. In addition, alloys, combinations, and multilayers of these materials can be used for the dielectric layer.

The source and drain electrodes are separated from the gate electrode by the dielectric layer, while the semiconductor layer can be over or under the source and drain electrodes. In certain embodiments the source and drain electrodes can be any sufficiently conductive material (e.g., metals such as aluminum, barium, calcium, chromium, gold, silver, nickel, palladium, platinum, titanium, or alloys thereof). Conductive polymers such as polyaniline, PEDOT:PSS, as well as combinations and multilayers thereof can also be used as source and drain electrodes. Some of these materials are appropriate for use with n-type semiconductor materials and others are appropriate for use with p-type semiconductor materials, as is known in the art.

The thin film electrodes can be provided by any of several means, including physical vapor deposition (e.g., thermal evaporation or sputtering) and ink jet printing. The patterning of these electrodes can be accomplished by known methods such as shadow masking, additive photolithography, subtractive photolithography, printing, microcontact printing, or pattern coating. A preferred method for providing thin film electrodes is thermal transfer imaging of metal composition (A), as disclosed above.

In certain embodiments, at least one of the electrodes of the group: gate electrode, source and drain electrodes; comprises a composition of a conducting polymer. Preferred conducting polymers, referred to herein as Conducting Polymers A, are selected from the group: polyaniline; polythiophene; polypyrrole; polyheteroaromatic vinylenes; and their derivatives. Descriptions of highly conductive polymers and methods for doping conductive polymers can be found in the following references: Bredas, J.-L. In *Handbook of Conducting Polymers*; Skotheim, T., Ed.; Marcel Dekker, Inc.: New York, 1986; Vol. 2, Chapter 25; MacDiarmid, A. G. *Angew. Chem. Int. Ed.* 2001, 40, 2581-2590 and Heeger, A. J. *Angew. Chem. Int. Ed.* 2001, 40, 2591-2611. U.S. Pat. Nos. 5,863,465 and 5,370,825, hereby incorporated by reference, describe the conducting and semiconducting properties of polyanilines. Organic acids, including plasticizing acids, are preferred dopants.

In one embodiment, the conductivity of polyanilines and derivatives thereof can be fine-tuned with dopants including organic acids and, optionally, carbon nanotubes to provide appropriate levels of conductivity, as described in US 2005/0116202, hereby incorporated by reference. Preferred conducting polymers comprise polyaniline dispersions of single wall carbon nanotubes (SWNT), preferably about 0.1 to 12 wt % SWNTs. Preferrably the polyaniline and derivatives thereof are further doped with an organic protonic acid having 1 to 30 carbons, said acid at a mole equivalent amount of about 25% to about 100% of the nitrogen or sulfur atoms in the polymer backbone. A preferred organic protonic acid is dinonylnaphthalene sulfonic acid (DNNSA). In this embodiment polyaniline is a preferred conducting polymer for doping with SWNTs and organic acids.

Figure 6:
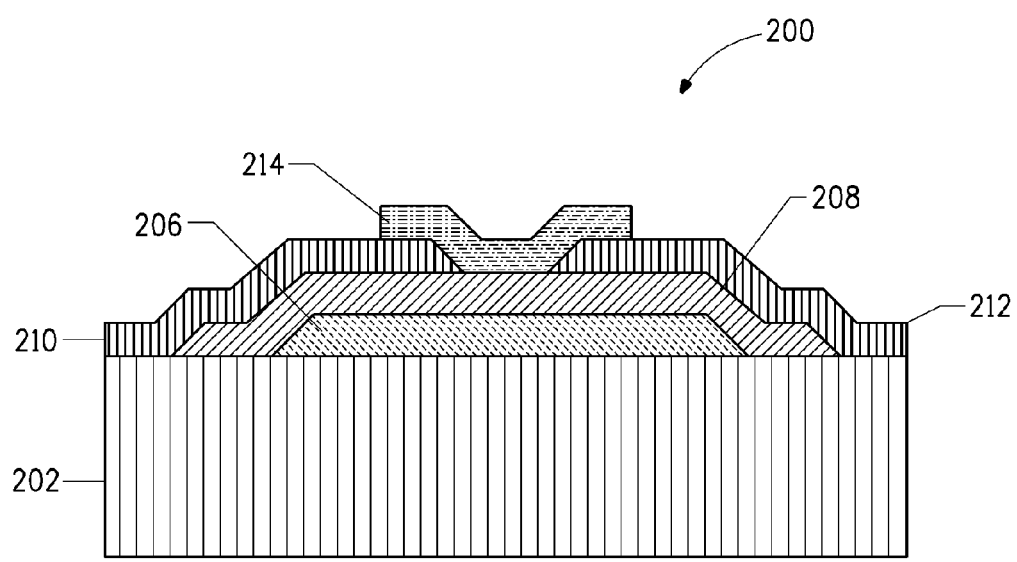
FIG. 6 is a cross-sectional view of a TFT formed using one embodiment of the invention.

The TFTs fabricated using the invention can be made with the thermal transfer metal donors and dielectric donors by iterative thermal transfer of one or more layers onto a receiver. FIG. 6 is a cross-sectional view of thermal imaging receiver 200 comprising base film 202, a patterned gate electrode 206 on base film 202, a patterned dielectric layer 208 on gate electrode 206, patterned source electrode 210 and drain electrode 212 on the dielectric layer 208, and a patterned semiconductor layer 214 contacting the patterned source and drain electrodes. The patterned gate conductor layer 206 and/or the patterned source and drain electrodes 210/212 can be put in place using the thermal transfer metal donor comprising metal composition (A) described above. The patterned dielectric layer 208 can be put in place using the thermal transfer dielectric donor comprising Layer A or Layer C described above. Each thermal imaging step can be improved by various embodiments of the process as described above.

Characterization of TFT devices provided herein, can be performed as follows:

Linear regime ($V_g <= V_{sd}$) mobility is calculated according to the equation:

$$\mu_{lin} = (L/WC_iV_{sd})(dI_d/dV_g) \qquad \text{Equation 1}$$

where $I_d$ is the drain current, $V_g$ is gate voltage, $V_{sd}$ is source-drain voltage, L is channel length, W is channel width, and $C_i$ is capacitance per unit area of the gate dielectric. $C_i$ is in units F/cm$^2$ and is calculated according to the following formula:

$$C_i = (\epsilon_o \epsilon / t)(10^{-4}) \qquad \text{Equation 2}$$

where $\epsilon_o$ is the permittivity constant, $\epsilon$ is the dielectric constant, and t is the dielectric thickness.

Saturation regime ($V_g >= V_{sd}$) mobility is calculated according to the equation:

$$\mu_{sat} = (2L(d\sqrt{I_d}/dV_g)^2)/(WC_i) \qquad \text{Equation 3}$$

Threshold voltage, $V_t$, is measured in the saturation regime. The square root of $I_d$ is plotted versus $V_g$. Extrapolation of a line from the steepest portion of the curve to the x-axis provides $V_t$.

Removal of peel defects is particularly useful in enhancing the quality of resolution of lines such as conductor lines in devices (e.g., touchpads, EMI shields, transistor arrays) and color filter lines in displays. Such enhancement of resolution is important in improving the visual appearance and/or performance of devices. For example in the case of touchpads and color filters, line resolution is important for enhancing the visual quality of the display. In the case of transistor arrays, peel defects bridging source and drain electrodes result in electrical shorts, thereby lowering yields if not removed. Removal of dielectric peel defects is also useful in transistor arrays, e.g., if a conductor line transverses a weakly adhered dielectric peel defect that subsequently detaches from the receiver, a break in the conductor line and a non-functioning area of the array will result.

Materials

Unless otherwise indicated, chemicals were used as received without further purification. Solvents were purchased from Aldrich and VWR and were of reagent-grade purity or higher; HPLC grade and preferably electronic grade solvents were used when available. Water was either deionized water, HPLC grade water from Aldrich, or purified water. Polymers, plasticizers, IR dyes, and surfactants were obtained from the sources listed in the specification or purchased from Aldrich. Pigments such as carbon black dispersions were obtained from Penn Color, Inc., Doylestown, Pa. All raw polyester films were obtained from DuPont Teijin Films (Wilmington, Del.). Silver nanoparticles were purchased from Ferro Co.—Electronic Material Systems; Nano-structured & Amorphous Materials, Inc., and Mitsui Co. HiPco raw carbon nanotubes were purchased form Carbon Nanotechnologies, Inc., Houston Tex. Kapton HN was obtained from DuPont De Nemours, Inc. (Circleville, Ohio). WPTS® 3737 (Water-Proof Transfer Sheet) was obtained from DuPont De Nemours, Inc. (Towanda, Pa.).

Coating

Coating of transfer and other layers onto donor and receiver elements was carried out utilizing stainless steel wrapped and formed 0.5 inch diameter coating rods purchased from R.D. Specialties, Inc. (RDS; Webster, N.Y.) and chrome-plated stainless steel formed 0.625 inch diameter rods with a CN profile purchased from Buschman Corporation (Cleveland, Ohio). The free surface of the donor was cleaned with a pressurized nitrogen stream immediately prior to coating to rid the surface of particle contamination. The coatings were drawn by hand on the donor mounted on a smooth glass surface or machine-coated utilizing a Water-Proof® Color Versatility coating system (CV coater) manufactured by DuPont De Nemours Inc. (Wilmington, Del.).

Coatings were stored in a controlled temperature/humidity environment with an average temperature of about 68° C. and about 40-50% average relative humidity.

Donor Substrates

Cr LTHC Layer. A base film of polyethylene terephthalate (PET, 50 microns thick in all examples unless stated otherwise) was coated with chrome metal in a vacuum deposition chamber. Metallization was carried out on PET films with and without light attenuating agents (670 nm absorbers). The chrome layer was coated at both 50% T and 40% T. In the examples, these donor films will be referred to as: 40% T Cr PET donor substrate and as 50% T Cr PET donor substrate; for the metallized films without light attenuating agents. The donor films with 670 nm absorbers incorporated in the base film will be referred to as: 40% T Cr Blue PET donor substrate and as 50% T Cr Blue PET donor substrate.

Organic LTHC Layer. The organic LTHC layer was prepared as reported in Formulation L of the Examples of PCT/US05/38009, referenced above:

A LTHC coating formulation was prepared from the following materials: (i) demineralized water: 894 g; (ii) dimethylaminoethanol: 5 g; (iii) Hampford dye 822 (Hampford Research; formula corresponds to SDA 4927): 10 g; (iv) polyester binder (Amertech Polyester Clear; American Inks and Coatings Corp; Valley Forge; Pa.): 65 g of a 30% aqueous solution; (v) TegoWet™ 251(4) (a polyether modified polysiloxane copolymer, Goldschmidt): 2.5 g; (vi) potassium dimethylaminoethanol ethyl phosphate: 14 g of an 11.5% aqueous solution [The 11.5% aqueous solution was prepared by combining three parts water and 0.5 parts ethyl acid phosphate (Stauffer Chemical Company, Westport, Conn.: Lubrizol, Wickliffe, Ohio) and sufficient 45% aqueous potassium hydroxide to achieve a pH of 4.5, followed by addition of sufficient dimethylaminoethanol to achieve a pH of 7.5 and finally dilution with water to achieve five parts total of final aqueous solution of 11.5 relative mass percent of water-free compound]; (vii) crosslinker Cymel™ 350 (a highly methylated, monomeric melamine formaldehyde resin, Cytec Industries Inc., West Paterson, N.J.): 10 g of a 20% solution; and (viii) ammonium p-toluene sulphonic acid: 2 g of a 10% aqueous solution.

Ingredients (ii) and (iii) were added to the water and allowed to stir for up to 24 hours before addition of the other ingredients in the order shown. The formulation was applied in an in-line coating technique as follows: The polymer base film composition was melt-extruded, cast onto a cooled rotating drum and stretched in the direction of extrusion to approximately 3 times its original dimensions at a temperature of 75° C. The cooled stretched film was then coated on one side with the LTHC coating composition to give a wet coating thickness of approximately 20 to 30 µm. A direct gravure coating system was used to apply the coatings to the film web. A 60QCH gravure roll (supplied by Pamarco) rotated through the solution, taking solution onto the gravure roll surface. The gravure roll rotated in the opposite direction to the film web and applied the coating to the web at one point of contact. The coated film was passed into a stenter oven at a temperature of 100-110° C. where the film was dried and stretched in the sideways direction to approximately 3 times its original dimensions. The biaxially stretched coated film was heat-set at a temperature of about 190° C. by conventional means. The coated polyester film was then wound onto a roll. The total thickness of the final film was 50 microns; the dry thickness of the transfer-assist coating layer was 0.07 microns. The PET support layer contained either Disperse Blue 60 or Solvent Green 28 dye to give a final dye concentration of typically 0.2% to 0.5% by weight in the polymer of the substrate layer. The polymer composition containing the Disperse Blue 60 dye (0.26% by weight) had an absorbance of 0.6±0.1 at 670 nm, and an absorbance of <0.08 at 830 nm. The polymer composition containing the Solvent Green 28 dye (0.40% by weight) had an absorbance of 1.2 at 670 nm, and an absorbance of <0.08 at 830 nm. These donor substrates will herein be referred to as: Organic LTHC Blue PET donor substrate and Organic LTHC Green PET donor substrate.

WPTS®: WaterProof® Transfer Sheet (WPTS® 3737; DuPont, Towanda) was used as the donor substrate for laminations. Immediately prior to coating on this substrate, the polyethylene coversheet was removed to expose the release layer of the WPTS® sheet. The coating was applied on this release layer.

Dielectric Measurements

Dielectric electrical properties were tested by laminating aqueous-based dielectrics from WPTS® onto a glass substrate pre-patterned with ten aluminum "fingers". A top aluminum electrode was then evaporated over the central portion of the substrate to form ten small capacitor structures. The dielectric constant was determined by measuring the complex admittance from 40 Hz to 110 MHz with an Agilent 4294 impedance bridge. The bulk resistivity was measured by applying a small dc voltage across the device (typically <5 V) and measuring the current through the film with a sensitive preamplifier. Care was taken to confine the measurement to the linear part of the I-V curve before space charge limited currents dominate.

Conductor Electrical Characterization

The sheet resistance and resistivity of conducting lines were obtained by measuring the resistance of lines with known geometries. A Cascade MicroTech (Beaverton, Oreg.) probestation model Alessi REL-6100 and a semiconductor parameter analyzer Agilent Technologies (Palo Alto, Calif.) model 4155C were used to apply a current across the lines and measure voltage drops at two known positions within the line. Typically, currents were swept from $1 \times 10^{-5}$ to $-1 \times 10^{-5}$ A to obtain voltages in the mV to V range. The slope of the I-V curve and the line geometry were used to obtain resistance, sheet resistance and resistivity. From these values conductivity and conductance can be calculated.

Transistor Electrical Characterization

Transistor electrical performance was measured in air at room temperature using common techniques, for example as shown in S. M. Sze, *Physics of Semiconductor Devices*, page 442, John Wiley and Sons, New York, 1981. A Cascade MicroTech (Beaverton, Oreg.) probestation model Alessi REL-6100 and a semiconductor parameter analyzer Agilent Technologies (Palo Alto, Calif.) model 4155C were used to obtain current versus gate voltage sweeps at constant drain voltage. Typically, gate voltage was swept from +30 to −50 V with a constant source-to-drain bias of −50 V. A plot of square root of current versus gate voltage, at constant drain voltage, was used to determine the saturation mobility. The slope of the straight line portion of the plot was used to define the transconductance. From the transconductance, the device width and length, and the specific dielectric capacitance, the transistor saturation mobility was calculated.

Thermal Imaging Equipment and Donor Mounting

Creo Trendsetter® 800 was utilized. The Creo Trendsetter® 800 was a modified drum-type imager utilizing a modified Thermal 1.7 Head with a 12.5 watt maximum average operating power at a wavelength of 830 nm with 5080 dpi resolution. The 800 Trendsetter® was operated in a controlled temperature/humidity environment with an average temperature of ~68° C. and an average relative humidity of ~40-50%. For each printing experiment, a section of thermal imaging receiver was positioned on the drum. The thermal imaging donor was loaded so that the side of the donor element coated with the transfer layer was facing the free side of the receiver. Imaging assemblages were exposed from the backside through the donor film base. Films were mounted using vacuum hold down to a standard plastic or metal carrier plate clamped mechanically to the drum. In some experiments utilizing the Creo Trendsetter® 800, a nonstandard drum with vacuum holes machined directly onto the drum to match common donor and receiver sizes was used as a replacement for the standard drum/carrier plate assemblage. Contact between the donor and receiver was established by ~600 mm of Hg vacuum pressure. Laser output was under computer control to build up the desired image pattern. Laser power and drum speed were controllable and were adjusted in an iterative fashion to optimize image quality as judged by visual inspection of the transferred image on the receiving surface.

Latex Binder Preparation

Latex binders that were used in the preparation of certain donor and receiver elements were prepared according to the procedures of WO 03/099574 with the materials reported in Table 1. Compositions are reported in Table 2 and were characterized by the analytical methods reported in WO 03/099574. Monomers and initiators were commercially available (Aldrich Chemical Co., Milwaukee, Wis.) and used as received. The surfactant was Polystep® B-7, a 29 wt % solution of ammonium lauryl sulphate in water (Stepan Co., Northfield, Ill.).

Chain Transfer Agent. This material was prepared as described in U.S. Pat. No. 5,362,826, Berge, et. al.: A 500 liter reactor was equipped with a reflux condenser and nitrogen atmosphere. The reactor was charged with methyl ethyl ketone (42.5 kg) and isopropyl-bis(borondifluorodimethylglyoximato) cobaltate (III) (Co III DMG) (104 g) and the contents brought to reflux. A mixture of Co III DMG (26.0 g), methyl methacrylate (260 kg), and methyl ethyl ketone (10.6 kg) was added to the reactor over a period of 4 hours. Starting at the same time, a mixture of Vazo 67® (DuPont, 5.21 kg) and methyl ethyl ketone (53.1 kg) was added to the reactor over a period of 5 hours. After the additions, the reactor contents were kept at reflux for another ½ hour. After cooling, this yielded 372 kg of a 70 wt % solution of Chain Transfer Agent (a chain transfer agent solution), which was used directly in the polymerizations.

TABLE 1

Materials for the Synthesis of Acrylic Latex Resins

| Reagent (grams) | Acrylic Latex Resin | | | | | | | | | |
|---|---|---|---|---|---|---|---|---|---|---|
| | LH-3 | LL-3 | LH-1 | LL-1 | LH-0 | LL-0 | LHEA-6 | LL-3-2GA | LH-3-2GA | LH-10-2GA |
| Polystep B-7 | 6.90 | 6.90 | 6.90 | 6.90 | 6.90 | 6.90 | 6.90 | 6.90 | 6.90 | 6.90 |
| Ammonium Persulfate | 0.40 | 0.20 | 0.20 | 0.20 | 0.40 | 0.20 | 0.20 | 0.40 | 0.40 | 0.40 |
| Methyl Methacrylate | 252.0 | 228.0 | 260.0 | 236.0 | 264.0 | 240.0 | 240.0 | 220.0 | 280.0 | 192.0 |
| Butyl Acrylate | 120.0 | 160.0 | 120.0 | 160.0 | 120.0 | 160.0 | 120.0 | 160.0 | 100.0 | 100.0 |
| Methacrylic Acid | 12.00 | 12.00 | 4.00 | 4.00 | 0 | 0 | 0 | 12.00 | 12.00 | 40.00 |
| Glycidyl Methacrylate | 0 | 0 | 0 | 0 | 0 | 0 | 0 | 8.00 | 8.00 | 8.00 |
| HEMA | 0 | 0 | 0 | 0 | 0 | 0 | 24 | 0 | 0 | 0 |
| Chain Transfer Soln | 16.0 | 0 | 16.0 | 0 | 16.0 | 0 | 16.0 | 0 | 0 | 0 |

HEMA: 2-Hydroxyethyl Methacrylate.

TABLE 2

Composition and Analytical Data for Latex Resins

| Resin | Solids | Chain Transfer Soln | MMA | BA | MAA | HEMA | GMA | Particle Diameter (nm) | Tg (°C.) | Mn/1000 | Mw/1000 |
|---|---|---|---|---|---|---|---|---|---|---|---|
| LH-3 | 32.6 | 4 | 63 | 30 | 3 | | | 75 | 56 | 57 | 135 |
| LL-3 | 33.3 | 0 | 57 | 40 | 3 | | | 93 | 33 | 244 | 1399 |
| LH-1 | 33.5 | 4 | 65 | 30 | 1 | | | 78 | 53 | 57 | 138 |
| LL-1 | 33.4 | 0 | 59 | 40 | 1 | | | 93 | 34 | 235 | 1539 |
| LH-0 | 32.8 | 4 | 66 | 30 | 0 | | | 70 | 53 | 53 | 145 |
| LL-0 | 33.4 | 0 | 60 | 40 | 0 | | | 92 | 34 | 69 | 341 |
| LHEA-6 | 32.6 | 4 | 60 | 30 | 0 | 6 | | 71 | 50 | 57 | 150 |
| LL-3-2GA | 33.4 | 0 | 55 | 40 | 3 | | 2 | 94 | 39 | | |
| LH-3-2GA | 33.5 | 0 | 70 | 25 | 3 | | 2 | 92 | 72 | | |
| LH-10-2GA | 33.5 | 0 | 48 | 40 | 10 | | 2 | 86 | 59 | | |

MMA: Methyl Methacrylate;
BA: Butyl Acrylate;
MAA: Methacrylic Acid;
HEMA: 2-Hydroxyethyl Methacrylate;
GMA: Glycidyl Methacrylate.

Receivers

Kapton® HN (5 mil; E.I. duPont de Nemours Co.) substrate was cleaned prior to use as a receiver by rinsing with methanol, wiping with a particle free cloth, and blowing off with a dry nitrogen stream. Surface-treated 5 mil Melinex® ST504 (DuPont Teijin Films) was used as received.

R-1, R-2 and R-3 PET receivers with an acrylic latex image receiving layer were prepared according to the procedure of WO 03/099574 (Flexible Receiver FR-1 Procedure) by slot-die coating an acrylic latex polymer dispersion with Zonyl® FSA as the surfactant onto 4 mil Melinex® 574 base film (DuPont-Teijin Films) or onto 4 mil Cronar® 471X (DuPont-Teijin Films) with an Elvax® 550 (ethylene vinyl acetate copolymer, DuPont) release layer between the acrylic image receiving layer and the Cronar® base film (Cronar®/Elvax®: WPTS®, DuPont). The preparation and compositions of the acrylic latex polymers are described above, and the receiver compositions are reported in Table 3.

TABLE 3

Receiver Material

| | Receiver | | |
|---|---|---|---|
| | R-1 | R-2 | R-3 |
| LH-3-2GA (33% Solids) | 2173 g | 2607.6 | — |
| LL-3-2GA (33% Solids) | 3259 g | 3910.8 | — |
| LH-10-2GA (33% Solids) | — | — | 12574.0 |
| N,N-Dimethylethanolamine (10% in water) | 75.0 g | 90.0 | 109.6 |
| Water (distilled) | 8713 g | 10455.6 | 221868.0 |
| Zonyl FSA | 30.0 g | 36.0 | 43.2 |
| Butyl Cellosolve | 750 g | 900.0 | 1106.0 |
| % Solids | 12% | 12% | 11.6% |
| Coating Weight | 13 mg/dm2 | 12.9 mg/dm2 | |
| Receiver | 4 mil Melinex® 574 | 1.25 mil Elvax® 550/Cronar® 471X | 2.5 mil Elvax® 550/Cronar® 471X |
| Polyethylene Cover Sheet | No | Yes | Yes |

General Procedure for the Preparation of Aqueous Dielectric Layers

A water solution was prepared by combining the specified amounts of water and, optionally, a 3 wt % ammonium hydroxide solution. Next, the IR dye, one-fourth of the water solution, and optional defoamers, surfactants and plasticizers were combined in a brown glass container and mixed well. The optional second binder was weighed in a container together with one-fourth of the water solution and mixed well. Optional filler(s) (e.g., carbon black, high κ nanoparticles) were weighed in another container with one-fourth of the water solution and mixed well. The binder was weighed in a large container with a stir bar and any remaining water solution was added. The contents of the second binder dispersion, the IR dye dispersion, and the filler dispersion were slowly added to the stirring binder. After stirring for at least 15 additional minutes, the formulation was filtered into a brown or foiled-coated container. The solution was filtered for a second time as it was syringed across the end of a donor sheet and was then coated. Unless specified otherwise, filtrations were carried out with 0.45 micron pore size syringe filters (25 mm GD/X Glass Microfiber GMF filter with Propylene Housing; Cat. No. 6894-2504 Whatman, Whatman Inc., Clifton, N.J.), and coatings were carried out using a CV coater with a Buschman Rod 7CN at 9.8 ft/min. Typically, 17.95 total wt % solids solutions were utilized to give films with a thickness of ~2.3 microns.

Dielectric Layer Compositions

Dielectric layers comprising styrene-acrylic and acrylic compositions were prepared from the components reported in Table 4. The electrical properties of these dielectrics were determined through the procedures described above.

Diel-4. (Tri-layer Dielectric Donor with Gradient Dye Layers) Using a CV coater, formulation Diel-4a (3 mL) was coated onto a 40% T Cr Blue donor substrate with a CN-3 rod at 9.8 ft/min and then dried for 6 min. at 45° C. This procedure was repeated for formulations Diel-4b and Diel-4c, coating Diel-4b on top of Diel-4a and Diel-4c on top of Diel-4b to give a trilayer dielectric with gradient dye layers.

TABLE 4

Styrene-Acrylic and Acrylic Dielectric Layer Compositions

| Dielectric | Polymer Amount Wt % | Polymer Amount Wt % | IR Dye Amount Wt % | Surfactant Amount Wt % | Other Additives Wt % | Solvent Amount | pH OD | Dielectric Constant (at $10^3$ Hz) Resistivity Ohm-cm |
|---|---|---|---|---|---|---|---|---|
| Diel-1 | J-95 16.780 g 93.6% | | SDA 2860 0.290 g 5.4% | Byk 348 0.055 g 1.0% | | $H_2O$ 12.840 g | 7.99 0.98 | |
| Diel-2 | LH-3 11.120 g 68.3% | LL-3 4.120 g 25.3% | SDA 2860 0.290 g 5.4% | Byk 345 0.055 g 1.0% | | $H_2O$/2BuO-Ethanol 12.96/1.38 g | 4.93 0.81 | 3.2 $1.9 \times 10^{15}$ |
| Diel-3 | LH-1 10.310 g 63.3% | LL-1 4.930 g 30.3% | SDA 2860 0.290 g 5.4% | Byk 345 0.055 g 1.0% | | $H_2O$/2BuO-Ethanol 12.96/1.39 g | 4.48 | |
| Diel-4a | LH-1 11.110 g 70.2% | LL-1 4.110 g 26.0% | SDA 4927 0.080 g 1.5% | Byk 348 0.100 g 1.9% | TEOE 0.023 g 0.40% | $H_2O$ 13.83 g | 3.93 | |
| Diel-4b | LH-1 11.110 g 68.9% | LL-1 4.110 g 25.5% | SDA 4927 0.185 g 3.5% | Byk 348 0.055 g 1.0% | TEOE 0.061 g 1.1% | $H_2O$ 14.55 g | 3.68 | |
| Diel-4c | LH-1 22.220 g 67.5% | LL-1 8.220 g 25.0% | SDA 4927 0.530 g 4.9% | Byk 348 0.110 g 1.0% | TEOE 0.176 g 1.6% | $H_2O$ 30.100 g | 3.52 | |

Wt % refers to wt % of the solids in the final dry formulation.
Abbreviations:
OD: Optical density of ~2.3 micron film;
2BuOEthanol: 2-ButoxyEthanol;
TEOE: Triethanolamine ethoxylate from Aldrich (cat. no. 416584).
Materials:
Acrylic latex compositions (LH and LL) are as described above.
Joncryl 95 (J-95) is an acrylic latex fom Johnson Polymer with Tg of 43° C., an acid number of 70, and a Z-average particle size of 40.5 nm.

Formulation and Coating of Pani-DNNSA-CNT Donors

Pani-7%: (7% HiPco CNT, Pani-DNNSA) A mixture of HiPco Raw CNT (0.1225 g), Disperbyk® 163 (0.066 g, BYK Chemie) and xylenes (27.612 g) was treated in a rt water bath with a sonication probe (Dukane Co. Model 40TP200, Transducer Model 41C28) for 10 min, during which time the mixture was stirred gently with a spatula at 5 min intervals. Then PANI-DNNSA [7.327 g, 24.23% by wt. in xylenes and 2-butoxyethanol (4:1 ratio) with 0.7 acid doping, synthesized according to U.S. Pat. No. 5,863,465] was added into the mixture, and the mixture was placed in a 45° C. water bath for 5 min. After equilibration of the temperature, the mixture was treated with sonication for 5 min, during which time the mixture was stirred gently with a spatula at one-minute intervals. The resulting dispersion was filtered through a 1.0 micron Nitex® 03-1/1 nylon screen (mesh count 690×470, pore size: 1 micron; Sefar America Inc., Depew, N.Y.). Into the filtrate was added 28.8 micro-L of a 10 wt % solution of Triton® X-114 in xylenes. The dispersion (13 mL) was coated onto a 40% T Cr PET donor substrate using a CV coater at 5.8 ft/min with a #10 CN formed Buschman rod and dried at 40° C. for 15 min.

Modified Pani-7% (mPani-7%): The following CNT-PANI donors were prepared according to the procedure for Pani-7%, except that a mixed solvent system [1,2-dichlorobenzene (DCB) and xylenes] was used: mPani-7%-a: 10% DCB; mPani-7%-b: 20% DCB; mPani-7%-c: 30% DCB.

Formulation and Coating of Silver Donors

Ag/Elv-#8: (87.5% Ag with Elvacite® 2028) A mixture of Ag powder (10.497 g; particle size: d50/d90=350/730 nm), a 20 wt % solution of Elvacite® 2028 in xylenes (7.512 g), and xylenes (12.006 g) was treated in a water bath with sonication for 1 h, during which time the mixture was stirred with a spatula at 0.5-h intervals. The mixture was then treated in a rt water bath with probe sonication for an additional 10 min, during which time the mixture was stirred gently with a spatula at 5-min intervals. The resulting dispersion was filtered with a 12 micron stainless screen (Twill Dutch Weave, mesh count 200×1400, absolute rating: 12-14 microns; Sefar America, Inc., Depew, N.Y.). The dispersion (10 mL) was coated onto a 40% T PET donor substrate using a CV coater at 5.8 ft/min using a #8 formed Buschman rod and dried at 33° C. for 15 min.

Ag/Elv-CN6: Above procedure was followed except using CN6 rod.

Ag/Elv-CN7: Above procedure was followed except using a CN7 rod.

Ag/Elv-CN8: Above procedure was followed except using a CN8 rod.

mAg/Elv-CN8: Above procedure was followed except using a CN8 rod and a solvent mixture of 50% DCB and 50% xylenes.

mAg/Elv-CN7: Above procedure was followed except using a CN7 rod and longer dispersion times: an extra 15 min before and an extra 5 min at the end of the sonication bath.

Ag/Elv/CNT-#8: (1% CNT and 87.5% Ag with Elvacite® 2028) A mixture of CNT (HiPco R0447, 0.0121 g), 1,2-dichlorobenzene (6.030 g) and xylenes (6.019 g) were dispersed with probe sonication for 15 min, during which time the mixture was stirred with a spatula at 5 min intervals. Next, Ag powder (10.503 g; particle size: d50/90=350/730 nm) and a 20 wt % solution of Elvacite® 2028 in xylenes (7.513 g) were added to the mixture, and the mixture was treated in a water bath with sonication for 1 h, during which time the mixture was stirred with a spatula at 0.5-h intervals. The mixture was then treated in a rt water bath with probe sonication for an additional 10 min, during which time the mixture was stirred gently with a spatula at 5-min intervals. The resulting dispersion was filtered with a 12 micron stainless screen (Twill Dutch Weave, mesh count 200×1400, absolute rating: 12-14 microns; Sefar America, Inc., Depew, N.Y.). The dispersion (10 mL) was coated onto a 40% T PET donor substrate using a CV coater at 5.8 ft/min with #8 formed Bushman rod and dried at 38° C. for 25 min.

Dispersions for Ag Layers of Examples 7-10

The dispersions were prepared according to the procedure for Ag/Elv/CNT-#8 utilizing the materials reported in Table 5 with the following exceptions: (a) the final probe sonication time was 15 min, (b) for Ag-1 through Ag-4, the resulting dispersion was filtered twice with 2.0 micron Whatman® MGF-150 syringe-disc filters, and (c) for Ag-5, the dispersion was filtered through 12 and 8 micron stainless steel screens (Twill Dutch Weave, mesh count 200×1400 and 325×2300, absolute filter rating: 12-14 and 8 microns, Sefar America Inc., Depew, N.Y.). The coating conditions and donor substrates are reported in the Examples utilizing these silver dispersions.

TABLE 5

Materials for Ag Nanoparticle Layers of Examples 7-10

| | Metal Powder | | | | Dispersant | | | Additives | |
|---|---|---|---|---|---|---|---|---|---|
| Entry No. | Solvent (g)$^a$ | M/wt %$^b$ | d50/d90 (nm)$^c$ | Wt. (g) | ID | Wt % | Dry wt. (g) | ID$^d$ | Dry wt. (g) |
| Ag-1 | Xylenes 15.006 | Ag/89.8 | 220/430 | 22.502 | Elvacite ® 2028$^e$ | 20 | 2.501 | DGD | 0.057 |
| Ag-2 | Xylenes 17.601 | Ag/88.8 | 350/730 | 20.042 | Elvacite ® 2028$^e$ | 20 | 2.476 | DGD | 0.063 |
| Ag-3 | DI H$_2$O 15.427 | Ag/87.1 | 220/430 | 26.250 | Joncryl ® 538$^f$ | 45 | 3.762 | Zonyl FSA 25 wt %$^g$ | 0.133 |
| Ag-4 | Xylenes 8.810 | Ag/88.6 | 350/730 | 10.031 | Elvacite ® 2028$^e$ | 20 | 1.240 | DGD/ SDA 4733 | 0.026/0.027 |
| Ag-5 | Xylenes 12.501 | Ag/89.9 | 870/1780 Flake | 22.564 | Elvacite ® 2028$^e$ | 20 | 2.5002 | DGD | 0.046 |

$^a$DI = deionized.
$^b$Weight % of the metal in the dry film.
$^c$Spherical particles were utilized unless indicated otherwise.
$^d$DGD = diethylene glycol dibenzoate.
$^e$Solution in xylenes.
$^f$Solution in water.
$^g$Solution in 1:1 water:isopropanol.

General Procedure for Semiconductor Evaporation

Shadow masks were fabricated from 2-4 mil thick nickel foil. Shadow mask alignment to the printed array was done by hand, using a light table and stereomicroscope. Careful manipulation of the printed array relative to the shadow mask allowed ~50 micron alignment over 6 inch arrays with minimal damage to the printed array. Once aligned, magnets were used to pinch the printed array and nickel shadow mask together and this was then reinforced with Kapton tape. Finally, the aligned mask/printed array was carefully rolled onto a vacuum deposition drum in a Kurt Lesker Evaporator and loaded for semiconductor evaporation. Semiconductor was deposited by sublimation under vacuum ($<3\times10^{-7}$ Torr) onto the free surface. The semiconductor was deposited with an initial rate of 0.1 Å/s up to 60 Å, and then at 0.5 Å/s until the desired thickness, typically 450 Å, was obtained, as determined by measurement with a quartz crystal microbalance. This procedure was carried out with pentacene and semiconductors SC-H1 and SC-H2.

Pattern 2: 600×50 micron source-drain channel; and (3) Transistor Pattern 3: 1350×50 micron source-drain channel. Next, the semiconductor was evaporated through a mask in the source-drain channel region according to the general procedure given above. The entire source-drain channel and surrounding region was covered with a rectangular patch of semiconductor in the case of Patterns 1 and 3. In the case of Pattern 2, a 450×400 micron patch of semiconductor was deposited in the channel region, to give a transistor with an effective channel of 450×50 microns.

Examples 1-6

Utilization of Adhesive Sheets in the Preparation of TFT Arrays

The TFT arrays reported in Examples 1-6 were prepared according to the above general procedure for printing bottom-gate transistors with associated capacitors, bus lines and test pads and according to the general procedure for semiconduc-

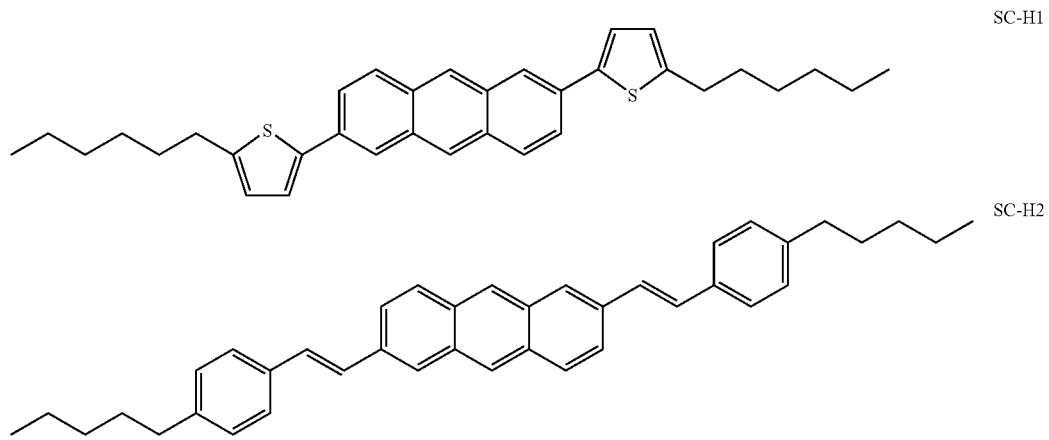

General Procedure for Printing a Bottom-Gate Transistor Array with Associated Capacitors and Bus Lines The above general procedure for printing and mounting with a Creo Trendsetter® 800 thermal platesetter was followed for all printed layers. First, the receiver was loaded onto the drum along with the gate (first layer) donor. Following printing, the gate donor was peeled away from the receiver to give a receiver with a patterned gate layer consisting of patterns of gate electrodes, capacitor electrodes, bus lines and test pads. Next, the dielectric donor was loaded onto the drum, printed, and peeled away from the receiver to give a receiver with consecutively patterned gate and dielectric layers. The dielectric layer was either patterned or printed as a solid block. Next, the source-drain donor was loaded onto the drum, printed, and peeled away from the receiver to give a receiver with patterned gate, dielectric and source-drain layers. The source-drain layer consisted of patterns of source-drain electrodes, capacitor electrodes, bus lines and test pads.

Multilayer printed transistor arrays were designed using a standard photolithography software package (L-Edit) and then converted to a single postscript file for each layer. Each postscript file was then used for layer-by-layer printing in the Trendsetter. Three patterns were utilized in these examples with both solid and patterned dielectrics: (1) Transistor Pattern 1: 150×15 micron source-drain channel; (2) Transistor tor evaporation. Details regarding donors and receivers, printing conditions, and TFT performance are given in Table A.

Procedure for removing peel defects from the source-drain layer with an adhesive sheet: Following source-drain printing and before evaporation of pentacene, peel defects between the source and drain electrodes were selectively removed from the receiver together with peel defects along line edges and other debris according to the following procedure: A piece of adhesive sheet (Table A-1) was cut to approximately the same size as the receiver and cleaned with a pressurized nitrogen stream to rid the surface of particle contamination. The receiver was placed on a flat surface, and the adhesive surface (e.g., the Cr surface of the 50% T Cr donor substrate, the dielectric-coated side of the dielectric donor substrate, the non-slip additive side of 200D LJX Mylar®) was placed on top of the receiver with the adhesive surface contacting the patterned surface of the receiver. A SDI Dust Removal System-1 roller was rolled over the entire area of the backside of the adhesive substrate in a period of approximately 30-90 seconds. The adhesive substrate was lifted off of the patterned receiver surface. Peel defects the size of the source-drain channel and other peel defects and debris were visible on the adhesive surface when it was examined under a microscope at 5× magnification.

Procedure for the removal of peel defects from the gate layer: This procedure is similar to that used for the source-drain layer with the following exceptions: After removal of the gate layer donor, the receiver was left in place on the Trendsetter® drum. The adhesive sheet was placed on top of the receiver and peel defects were removed as previously described for the source-drain layer.

Example 5

Examples 5a and 5b compare two different transistor sets printed with the same materials (same donor sheets) onto the same receiver but with different dielectric printing conditions. The printing conditions for 5a were more optimal and resulted in fewer peel defects between the source and drain electrodes. By utilizing an adhesive sheet, the yield of 5b was brought to within 10% of that of 5a.

Example 6

Examples 6a-d compare four different transistor sets printed with the same materials (same donor sheets) and the same printing conditions onto the same receiver. Yields were generally high, but the transistor set of 6a showed the fewest peel defects between the source-drain electrodes in a visual inspection with a microscope at 5× magnification. Therefore, this experiment was selected as the control and no adhesive sheet was used on it. Examples 6b-d exhibited more peel defects bridging source and drain electrodes than 6a and the following adhesive sheets were used: 6b: 50% T Cr PET donor substrate; 6c: 200D LJX Mylar®; and 6d: Diel-3 donor substrate. Use of the 50% T Cr PET donor substrate as the adhesive sheet gave the least number of shorted transistors (Table A-3) while use of the Diel-3 adhesive sheet gave the narrowest threshold distributions and mobility distributions (Table A-4).

TABLE A-1

Donors and Materials for Printed TFT Arrays

| Ex | Gate Donor | Dielectric Donor | Source-Drain Donor | Adhesive Sheet | Semiconductor |
|---|---|---|---|---|---|
| 1 | mPani-7%-b | Diel-1 40% T Cr Blue PET donor substrate; 40 min additional dry at 45° C. | Pani-7% | 50% T Cr LJX donor substrate applied to S-D layer | Evaporated Pentacene |
| 2 | Pani-7% | Diel-2 50% T Cr Blue PET donor substrate; 40 min additional dry at 50° C. | Ag/ElvCNT-#8 60 min additional dry at 50° C. | 50% T Cr LJX donor substrate applied to Gate layer | Evaporated Pentacene |
| 3 | mAg/Elv-CN8 40 min additional dry at 45° C. | Diel-3 50% T Cr Blue PET donor substrate; 40 min additional dry at 45° C. | Pani-7% 40 min additional dry at 50° C. | 50% T Cr LJX donor substrate applied to S-D layer | Evaporated SC-H1 |
| 4 | mAg/Elv-CN8 40 min additional dry at 45° C. | Diel-3 50% T Cr Blue PET donor substrate; 40 min additional dry at 45° C. | Pani-7% 40 min additional dry at 50° C. | 50% T Cr LJX donor substrate applied to S-D layer | Evaporated SC-H2 |
| 5a | Ag/Elv-CN8 40 min additional dry at 50° C. | Diel-4 40% T Cr Blue PET donor substrate; 40 min additional dry at 45° C. | Pani-7% 40 min additional dry at 50° C. | None | Evaporated Pentacene |
| 5b | Ag/Elv-CN8 40 min additional dry at 50° C. | Diel-4 40% T Cr Blue PET donor substrate; 40 min additional dry at 45° C. | Pani-7% 40 min additional dry at 50° C. | 50% T Cr LJX donor substrate applied to S-D layer | Evaporated Pentacene |
| 6a | Ag/Elv-CN7 60 min additional dry at 50° C. | Diel-3 40% T Cr Blue PET donor substrate; 40 min additional dry at 45° C. | Pani-7% 40 min additional dry at 45° C. | None | Evaporated Pentacene |
| 6b | Ag/Elv-CN7 60 min additional dry at 50° C. | Diel-3 40% T Cr Blue PET donor substrate; 40 min additional dry at 45° C. | Pani-7% 40 min additional dry at 45° C. | 200D LJX Mylar ® applied to S-D layer | Evaporated Pentacene |
| 6c | Ag/Elv-CN7 60 min additional dry at 50° C. | Diel-3 40% T Cr Blue PET donor substrate; 40 min additional dry at 45° C. | Pani-7% 40 min additional dry at 45° C. | 50% T Cr LJX donor substrate applied to S-D layer | Evaporated Pentacene |
| 6d | Ag/Elv-CN7 60 min additional dry at 50° C. | Diel-3 40% T Cr Blue PET donor substrate; 40 min additional dry at 45° C. | Pani-7% 40 min additional dry at 45° C. | Diel-3 on 40% T Cr Blue PET donor substrate applied to S-D layer | Evaporated Pentacene |

Receiver: 5 mil Kapton HN (DuPont);
Materials: 200D LJX Mylar ® (DuPont);
Abbreviations:
S-D: Source-Drain.

TABLE A-2

Printing Patterns and Parameters for Printed TFT Arrays

| Ex | TFT Pattern | Dielectric Pattern | Gate | Dielectric | Source-Drain |
|---|---|---|---|---|---|
| 1 | 3 | Solid | DS = 205 at 5.6 W | DS = 180 at 7.75 W | DS = 205 at 5.75 W |
| 2 | 1 | Solid | DS = 205 at 5.7 W | DS = 160 at 7.50 W | DS = 160 at 7.30 W |
| 3 | 2 | Solid | DS = 160 at 7.8 W | DS = 160 at 7.35 W | DS = 205 at 5.50 W |
| 4 | 2 | Solid | DS = 160 at 7.8 W | DS = 160 at 7.35 W | DS = 205 at 5.50 W |
| 5a | 2 | Solid | DS = 160 at 7.6 W | DS = 200 at 9.5 W | DS = 205 at 5.60 W |
| 5b | 2 | Solid | DS = 160 at 7.6 W | DS = 160 at 8.25 W | DS = 205 at 5.60 W |
| 6a | 2 | Solid | DS = 160 at 7.6 W | DS = 160 at 7.40 W | DS = 205 at 5.60 W |
| 6b | 2 | Solid | DS = 160 at 7.6 W | DS = 160 at 7.40 W | DS = 205 at 5.60 W |
| 6c | 2 | Solid | DS = 160 at 7.6 W | DS = 160 at 7.40 W | DS = 205 at 5.60 W |
| 6d | 2 | Solid | DS = 160 at 7.6 W | DS = 160 at 7.40 W | DS = 205 at 5.60 W |

TABLE A-3

Electrical Performance of Printed TFT Arrays

| Ex | Array Size | Median Mobility ($cm^2V^{-1}s^{-1}$) | Median $V_{Th}$ (V) | Median $I_{off}$ (A) | Median $I_{on}/I_{off}$ | Yield |
|---|---|---|---|---|---|---|
| 1 | 108 | 0.05 | −7 | 1.0E−10 | 3.2E+03 | 75.9% |
| 2 | 54 | 0.02 | 5 | 1.0E−10 | 3.2E+03 | 100%[a] |
| 3 | 108 | 0.00025 | −22 | 3.2E−12 | 6.3E+02 | 76.9% |
| 4 | 54 | 0.008 | −18 | 6.3E−12 | 6.3E+02 | 92.6% |
| 5a | 54 | 0.025 | −12 | 6.3E−12 | 4.0E+04 | 92.6% |
| 5b | 54 | 0.045 | −12 | 1.0E−11 | 5.6E+04 | 83.3% |
| 6a | 54 | 0.07 | −5 | 5.0E−11 | 2.0E+04 | 94.4% |
| 6b | 54 | 0.11 | −8 | 5.0E−11 | 3.2E+04 | 87.0% |
| 6c | 54 | 0.077 | −8 | 5.0E−11 | 3.2E+04 | 90.7% |
| 6d | 54 | 0.06 | −9 | 5.0E−11 | 3.2E+04 | 85.2% |

[a]Yield of corresponding capacitor array is also 100%, e.g., 100% of the 54 capacitors have $I_{leaks}$ of less than 1.0E−10 A with a median $I_{leaks}$ of 3.2E−12 A.

TABLE A-4

Effect of Adhesive Sheet on Electrical Performance of Printed TFT Arrays

| Ex | Array Size | Adhesive Sheet | Mobility Distribution ($cm^2V^{-1}s^{-1}$)[a] | $V_{Th}$ (V) Distribution[b] |
|---|---|---|---|---|
| 6a | 54 | None | 0–0.28 | −15 to 5 |
| 6b | 54 | 200D LJX Mylar | 0–0.3 | −15 to 0 |
| 6c | 54 | 50% T Cr PET | 0–0.24 | −20 to 5 |
| 6d | 54 | Diel 3 | 0.01–0.1 | −15 to −5 |

[a]100% of the transistors fall within this distribution.
[b]Greater than 85% of the transistors fall within this distribution.

Examples 7-10

Utilization of Adhesive Sheets to Improve Quality of Imaged Pattern

Example 7

PANI-CNT

Ag Nanoparticle Multi-Layer

This example illustrates the process of the invention wherein a thermal imaging substrate was fabricated with a base film; chrome LTHC layer; and polyaniline-carbon nanotube (PANI-CNT) and silver transfer layers in layered sequence. Thermal transfer onto a receiver comprising a surface-treated base film gave a receiver element with a base film, surface treatment, and patterned silver and PANI-CNT layers in layered sequence. Post-processing steps improved line-edge quality.

A. Preparation of PANI-CNT—Ag Nanoparticle Multi-Layer Donor Substrate (a) Preparation and coating of polyaniline layer. mPani-7%-c was prepared according to the above general procedure. The dispersion (10.9 mL) was coated onto a 40% T Cr PET donor substrate (~90 by 52 cm) using a CV coater at 5.8 ft/min with a CN#12 formed Buschman rod and dried at 40° C. for 25 minutes.

(b) Preparation and coating of silver layer. Ag-2 (Table 5) was prepared according to the above general procedure. The dispersion (7 mL) was coated onto the PANI-CNT layer on the 40% T Cr PET donor substrate using a CV coater at 5.8 ft/min with a CN#6 formed Buschman rod and dried at 48° C. for 20 minutes.

B. Thermal Transfer Process for Patterning PANI-CNT—Ag Nanoparticle Multi-Layer.

A portion of the multi-layer donor (~30 cm×20 cm) and a thermal imaging Melinex® ST 504 receiver (~28 cm×18 cm) were loaded into the Creo Trendsetter® 800 thermal plateset-ter according to the procedure described above. Blocks (4.75 cm×1.5 cm) of serpentine patterns were printed with 200, 100, and 50 micron line widths with spacing between the lines equivalent to the line width. Printing parameters were as follows: surface depth=47; surface reflectivity=0.52; escan=0. The patterns were printed at drum speed 120 (7.5-10.75 W in 0.25 W increments) and drum speed 60 (4.5-8 W in 0.25 W increments).

C. Thermal Transfer Evaluation and Post-Processing.

Transfer was incomplete at drum speed 60. Transfer was complete at drum speed 120 but, with the exception of the 200 micron lines printed at 9.25 W and above, material in non-exposed regions between the printed lines was transferred along with the lines. Contact of an adhesive surface (Scotch® tape, 60 sec) with the 50 micron lines printed at drum speed 120 at 9.75 W selectively removed the material between the lines to yield the desired 50 micron serpentine pattern on the receiver with clean line edges and no line breaks.

D. Electrical Characterization.

Sheet resistance was measured according to the standard procedure given above. Rsh of less than 1 ohm/sq was measured for lines printed at drum speed 120 at 7.75 W and above, with Rsh measuring 0.4 ohm/sq at 10 W and above.

Example 8

PANI-CNT

Ag Nanoparticle—Dielectric Multi-Layer

This example illustrates the process of the invention wherein a thermal imaging substrate was fabricated with a base film; chrome LTHC layer; and PANI-CNT, silver, and dielectric transfer layers in layered sequence. Thermal transfer onto a receiver comprising a surface-treated base film gave a receiver element with a base film, surface treatment, and patterned dielectric, silver and PANI-CNT layers in layered sequence. Thermal transfer onto a receiver comprising a surface-treated base film with a patterned PANI-CNT layer gave a receiver element with a base film, surface treatment, and patterned PANI-CNT, dielectric, silver and PANI-CNT layers in layered sequence. Post-processing steps improved line-edge quality.

A. Preparation of Multilayer PANI-CNT—Ag Nanoparticle—Dielectric Donor Substrate (a) Preparation and coating of polyaniline layer. Procedure was identical to that described above in Example 7-A-a.

(b) Preparation and coating of silver layer. Ag-3 (Table 5) was prepared according to the above general procedure. The dispersion (5 mL) was coated onto the PANI-CNT layer on the 40% T Cr PET donor substrate (~90 by 52 cm) using a CV coater at 5.8 ft/min with a CN#7 formed Buschman rod and dried at 49° C. for 20 minutes.

(c) Preparation and coating of dielectric layer. General aqueous dielectric layer formulation procedure was followed using 16.76 g of Joncryl® 63 (30 wt %), 16.78 g of Joncryl® 95 (30 wt %), 0.21 g of SDA 2860, 0.50 g of Byk® 348 (10 wt % in water), and 23.26 g of water to give a formulation with a pH of 8.51. The resulting solution (3 mL) was coated onto the silver nanoparticle layer with a CN#2 formed Buschman rod at 6.3 ft/min with a CV coater and dried at 45° C. for 6 minutes. The wt % of materials in the dried coating was as follows: 48.7 wt % Joncryl® 63, 48.8 wt % Joncryl® 95, 2.0 wt % SDA 2860, and 0.50 wt % Byk® 348. [Joncryl® 63 is a solution of a water-soluble styrene acrylic resin with a pH of 8.4, MW of 12,000, acid number of 213 and Tg of 73. Joncryl® 95 is an emulsion of an ammonia salt of modified styrene acrylic polymers with a pH of 8.0 and an acid number of 70. Both are from Johnson Polymer.]

B. Preparation of a Thermal Imaging Receiver with a Patterned PANI-CNT Layer (a) Preparation and coating of PANI-CNT donor substrate. Procedure and materials for the dispersion were identical to those of Example 7-A-a except that xylenes was used as the solvent instead of the xylenes/1,2-dichlorobenzene mixture. The amounts of materials utilized were as follows: 0.1230 g of HiPco Raw CNT, 0.063 g of Disperbyk® 163, 29.680 g of xylenes, 5.144 g of PANI-DNNSA [31.68% by wt. in xylenes and 2-butoxyethanol (4:1 ratio) with 0.7 acid doping], and 28.9 micro-L of Triton® X 114 (10 wt % in xylenes). The dispersion (10.9 mL) was coated onto a 40% T Cr PET donor substrate (~90 cm×52 cm) using a CV coater at 5.8 ft/min with CN#10 formed Buschman rod and dried at 45° C. for 20 minutes.

(b) Thermal transfer process for patterning PANI-CNT layer on base film of receiver. A portion of the PANI-CNT donor (~30 cm×20 cm; dried for an additional 60 min at 50° C. five months prior to the thermal transfer experiment) and a thermal imaging Melinex® ST 504 receiver (~28 cm×18 cm) were loaded into the Creo Trendsetter® 800 thermal platesetter according to the general procedure described above. Two rectangular patterns (1.25 cm×0.75 cm), one a solid block of material (herein referred to as the solid-block pattern) and one in which the material was patterned into vertical lines of 120 microns in width with spacing of 240 microns (herein referred to as the vertical-line pattern), were utilized as the patterns in this printing experiment. Two rows (rows 1 and 2) were printed with thirteen alternating solid-block and vertical-line patterns in each line. Printing parameters were as follows: drum speed=160; surface depth=47; surface reflectivity=0.46; escan=0; power=5.75 W (row 1) and 5.45 W (row 2).

C. Thermal Transfer Process for Patterning PANI-CNT—Ag Nanoparticle—Dielectric Multi-Layer.

The PANI-CNT donor was removed from the drum while leaving the patterned receiver in place on the drum. A portion of the multi-layer donor (~30 cm×20 cm) was loaded into the Creo Trendsetter® 800 thermal platesetter according to the general procedure described above. Printing parameters for all rows were as follows: surface depth=47; surface reflectivity=0.54; escan=0; alternating solid-block and vertical line patterns. Row 1: Multi-layer printed on top of the patterned PANI-CNT layer at drum speed 120 from 7.50 to 10.50 W in 0.25 W increments. Row 2: Multi-layer printed on top of the patterned PANI-CNT layer at drum speed 160 from 9.00 to 12.00 W in 0.25 W increments. Row 3: Multi-layer printed onto the receiver surface at drum speed 160 from 7.50 to 10.50 W in 0.25 W increments.

D. Thermal Transfer Evaluation and Post-Processing.

The multilayer transferred to varying extents at all powers with optimal quality and highest degree of transfer observed at 7.5-8.25 W for Row 1, 9.25-10 W for Row 2, and 8-8.25 W for Row 3. In all three rows, material in non-exposed regions between the printed lines was transferred along with the lines. The material that was transferred between the lines was very loosely adhered to the receiver and to the lines themselves and could be easily and selectively removed by contact with an adhesive surface, leaving the desired line pattern on the receiver. This was exemplified in Row 1 (10.5 W), Row 2 (12.0 W) and Row 3 (10.5 W) using a tacky roller and in Row 3 (10.25 W) using Scotch® tape (1 min contact).

Example 9

Black

Ag Nanoparticle—Dielectric Multi-Layer

This example illustrates the process of the invention wherein a thermal imaging substrate was fabricated with a base film; chrome LTHC layer; and black, silver, and dielectric transfer layers in layered sequence. Thermal transfer onto a receiver comprising a surface-treated base film gave a receiver element with a base film, surface treatment, and patterned dielectric, silver and black layers in layered sequence. Thermal transfer onto a receiver comprising a surface-treated base film with a patterned PANI-CNT layer gave a receiver element with a base film, surface treatment and patterned PANI-CNT, dielectric, silver and black layers in layered sequence. Thermal transfer onto a receiver comprising a surface-treated base film with a patterned silver nanoparticle layer gave a receiver element with a base film, surface treatment and patterned silver, dielectric, silver and black layers in layered sequence. Post-processing steps of the invention improved line-edge quality.

A. Preparation of Multilayer Black—Ag Nanoparticle—Dielectric Donor Substrate (a) Preparation and coating of black layer. General aqueous transfer layer formulation procedure was followed using 12.60 g of Joncryl® 56 (27 wt %), 4.93 g of Latex LL-1 (30 wt %), 0.025 g of SDA 2860, 0.050 g of Byk® 348, 0.910 g of Carbon Black Acroverse Paste 32B56 (33 wt %; Penn Color), and 11.60 g of water to give a formulation with a pH of 9.20. The resulting solution (3 mL) was coated onto the 40% T Cr Blue PET donor substrate (~90 by 52 cm) using a CV coater with a CN#2 formed Buschman rod at 6.3 ft/min and dried at 45° C. for 6 minutes. The wt % of materials in the dried coating was as follows: 63.0 wt % Joncryl® 56, 30.1 wt % Latex LL-1, 0.5 wt % SDA 2860, 0.90 wt % Byk® 348, and 5.6 wt % 32B56 Carbon Black. [Joncryl® 56 is a solution of a water-soluble styrene acrylic resin with a pH of 9.1, MW of 4,600, acid number of 108 and Tg of 60 from Johnson Polymer.]

(b) Preparation and coating of silver layer. Ag-1 (Table 5) was prepared according to the above general procedure. The dispersion (7 mL) was coated onto the black layer on the 40% T Cr Blue PET donor substrate using a CV coater at 5.8 ft/min with a CN#6 formed Buschman rod and dried at 48° C. for 20 min and later for 60 min at 50° C.

(c) Preparation and coating of dielectric layer. Formulation and coating process were identical to that of Example 8-A-c. The donor was dried for an additional 45 min at 45° C. immediately prior to the thermal transfer experiment.

B. Preparation of a Thermal Imaging Receiver with a Patterned PANI-CNT Layer in Rows 1 and 2 and a Patterned Silver Nanoparticle Layer in Row 3

(a) Preparation and coating of PANI-CNT donor substrate. Formulation and coating were identical to that of Example 8-B-a.

(b) Thermal transfer process for patterning PANI-CNT layer on base film of receiver. Process was identical to that of Example 8-B-b with the following exceptions: surface reflectivity=0.54; power=5.5 W (Rows 1 & 2), fourteen alternating patterns were printed in Row 2.

(c) Preparation and coating of silver nanoparticle donor substrate. Ag-4 (Table 5) was prepared according to the above general procedure. The dispersion (8 mL) was coated onto Melinex® 453 donor film (~90 by 52 cm) using a CV coater at 5.8 ft/min with a CN#6 formed Buschman rod and dried at 47° C. for 20 min. The donor was dried for an additional 60 min at 50° C. approximately three weeks prior to the thermal transfer experiment.

(d) Thermal transfer process for patterning silver nanoparticle layer on base film of receiver. The PANI-CNT donor was removed from the drum while leaving the patterned receiver in place on the drum. A portion of the silver nanoparticle donor (~30 cm×20 cm) was loaded into the Creo Trendsetter® 800 thermal platesetter according to the general procedure described above. Fourteen alternating solid-block patterns and vertical-line patterns (1.25×0.75 cm) were printed in Row 3. Printing parameters were as follows: drum speed=40; surface depth=30; surface reflectivity=0.48; escan=0; power=4.8 W.

C. Thermal Transfer Process for Patterning Black—Ag Nanoparticle—Dielectric Multi-Layer.

The silver nanoparticle donor was removed from the drum while leaving the patterned receiver in place on the drum. A portion of the multi-layer donor (~30 cm×20 cm) was loaded into the Creo Trendsetter® 800 thermal platesetter according to the general procedure described above. Printing parameters for all rows were as follows: surface depth=60; surface reflectivity=0.30; escan=0; alternating solid-block and vertical line patterns (1.25×0.75 cm). Row 1: Multi-layer was printed directly on top of the patterned PANI-CNT layer at drum speed 40 from 4.00 to 7.25 W in 0.25 W increments. Row 2: Multi-layer was printed on top of and slightly offset from the patterned PANI-CNT layer at drum speed 100 from 6.00 to 9.25 W in 0.25 W increments. Row 3: Multi-layer was printed on top of the patterned silver nanoparticle layer at drum speed 40 from 3.50 to 7.40 W in 0.30 W increments. Row 4: Multi-layer was printed onto the receiver surface at drum speed 40 from 3.50 to 7.40 W in 0.30 W increments.

D. Thermal Transfer Evaluation and Post-Processing.

Complete transfer of the multilayer was observed at 4.5 W for Row 1, at 3.75-4.75 W for Row 3 and at 3.5-4.5 W for Row 4. For Row 2, the offset multilayer transferred to varying extents at the different powers onto both the patterned PANI-CNT layer and onto the receiver. In all four rows, some material in non-exposed regions between the printed lines was transferred along with the lines. For Rows 3 and 4, the material that was transferred between the lines could be easily and selectively removed by contact with an adhesive surface, leaving the desired line pattern on the receiver. This was exemplified in Row 3 (4.75 W) and Row 4 (3.75 W) with Scotch® tape (30-60 sec contact).

Example 10

An Nanoparticle

Dielectric Multi-Layer

This example illustrates the process of the invention wherein a thermal imaging substrate was fabricated comprising a base film; organic LTHC layer; and silver and dielectric transfer layers in layered sequence. Thermal transfer to a receiver comprising a surface-treated base film gave a receiver element with a base film, surface treatment and patterned dielectric and silver transfer layers in layered sequence. Post-processing steps improved line-edge quality.

A. Preparation of Ag Nanoparticle—Dielectric Multi-Layer Donor Substrate (a) Preparation and coating of silver layer. Ag-5 (Table 5) was prepared according to the above general procedure. The dispersion (14 mL) was coated onto an Organic LTHC Green PET donor substrate (~90 by 52 cm) using a CV coater at 5.8 film with a CN#10 formed Buschman rod and dried at 47° C. for 20 minutes to give a film with a thickness of 2.9 microns.

(b) Preparation and coating of dielectric layer. Formulation and coating were identical to that of Example 8-A-c. The donor was dried for an additional 60 min at 50° C. immediately prior to the thermal transfer experiment.

B. Thermal Transfer Process for Patterning Ag Nanoparticle—Dielectric Multi-Layer.

A portion of the multi-layer donor (~30×20 cm) and a thermal imaging Melinex® ST 504 receiver (~28 cm×18 cm) were loaded into the Creo Trendsetter® 800 thermal platesetter according to the procedure described above. Blocks of serpentine patterns were printed with 200, 100, and 50 micron line widths with spacing between the lines equivalent to the line width. Printing parameters were as follows: surface depth=70; surface reflectivity=0.3; escan=0. The patterns were printed at drum speed 120 (8.5-12 W in 0.25 W increments), drum speed 60 (5.5-9 W in 0.25 W increments), and drum speed 40 (5-8.5 W in 0.25 W increments).

C. Thermal Transfer Evaluation and Post-Processing.

Transfer was complete at all drum speeds and powers with the exception of drum speed 120 at 8.5-9.25 W. For the 100 and, particularly, 50 micron lines, material in non-exposed regions between the printed lines was transferred along with the lines. Contact with an adhesive surface (Scotch tape, 60 sec) selectively removed the material between the 50 micron serpentine lines that were printed with drum speed 40 at 8.25 W to yield the desired pattern on the receiver with clean line edges and no line breaks.

What we claim is:

1. A process comprising
   a) providing a thermally transferred pattern on an imaged thermal transfer receiver, wherein the imaged thermal transfer receiver comprises a surface having an exposed portion and a non-exposed portion of one or more thermally transferred layer(s);
   b) contacting said surface with an adhesive layer for a contact period to provide a laminate; and
   c) separating said adhesive layer from the laminate to remove the non-exposed portion of one or more thermally transferred layers; whereby a treated thermal transfer receiver having a surface substantially free of said non-exposed portion of one or more thermally transferred layer(s) is provided; and
   d) optionally transferring one or more additional patterns onto the receiver and repeating steps b and c.

2. The process of claim 1 wherein the adhesive layer comprises a base film.

3. The process of claim 2 wherein the base film comprises a polymeric material selected from the group consisting of: poly(vinyl chloride), poly(ethylene), poly(propylene), poly(carbonate), polyethylene terephthalate, triacetyl cellulose, polyethylene naphthalate, and polyimide.

4. The process of claim 2 wherein the adhesive layer further comprises a metallized layer.

5. The process of claim 4 wherein the metallized layer comprises a metal selected from the group consisting of: Ti, Zr, V, Nb, Cr, Mo, W, Mn, Fe, Go, Ni, Cu, Ag, and Al, and alloys thereof.

6. The process of claim 2 wherein the adhesive layer further comprises an adhesive dielectric layer comprising one or more dielectric polymer(s).

7. The process of claim 6 wherein the adhesive dielectric layer comprises one or more dielectric polymer(s) selected from the group consisting of: acrylic and styrenic polymers selected from the group consisting of: acrylic, styrenic and styrenic-acrylic latex, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenolaldehyde (co)polymers and (co)oligomers and combinations thereof; and poly(vinyl acetate).

8. The process of claim 7 wherein the one or more dielectric polymer(s) is selected from the group consisting of: acrylic and styrenic polymers selected from the group consisting of: acrylic, styrenic and styrenic-acrylic latexes, solution-based acrylic, styrenic and styrenic-acrylic polymers, and combinations thereof.

9. The process of claim 7 wherein the one or more dielectric polymer(s) is selected from the group consisting of: acrylic, styrenic and styrenic-acrylic latexes; comprising at least about 85 wt % of monomers selected from the group consisting of: alkyl (meth)acrylate, styrene, and alkyl-substituted styrene wherein the alkyl group is a C1 to C18 straight or branched chain alkyl group.

10. The process of claim 1 wherein the contact period is about 1 second to about 90 seconds.

11. The process of claim 1 wherein the one or more thermally transferred layer(s) comprises nanoparticles that have an average longest dimension of about 5 nm to about 1500 nm.

12. The process of claim 11 wherein the nanoparticles comprise a metal powder.

13. The process of claim 12 wherein the metal powder is selected from the group consisting of: Ag, Cu, and alloys thereof.

14. The process of claim 1 wherein the one or more thermally transferred layer(s) comprises one or more conducting polymers selected from the group consisting of: polyaniline; polythiophene; polypyrrole; polyheteroaromatic vinylenes; and their derivatives.

15. The process of claim 1 wherein the one or more thermally transferred layer(s) comprises one or more dielectric polymer(s).

16. The process of claim 15 wherein the one or more dielectric polymer(s) is selected from the group consisting of: acrylic and styrenic polymers selected from the group consisting of: acrylic, styrenic and styrenic-acrylic latexes, solution-based acrylic, styrenic and styrenic-acrylic polymers, and combinations thereof; heteroatom-substituted styrenic polymers selected from the group consisting of: partially hydrogenated poly(4-hydroxy)styrene, poly(4-hydroxy)styrene, and copolymers of poly(4-hydroxy)styrene with hydroxyethyl (meth)acrylate, alkyl (meth)acrylate, styrene, and alkyl-substituted styrene wherein the alkyl group is a C1 to C18 straight or branched chain alkyl group; phenol-aldehyde (co)polymers and (co)oligomers and combinations thereof; and poly(vinyl acetate).

17. The process of claim 1 wherein the one or more thermally transferred layer(s) comprises a pigment.

18. The process of claim 17 wherein the pigment is selected from the group consisting of black pigments selected from the group consisting of: graphite, carbon black and metal oxides selected from the group consisting of: oxides of copper, copper-cobalt alloy and ruthenium; colored pigments selected from the group consisting of: cyanine, phthalocyanine, azo, pyrrolidone, and quinonacridine based pigments; and white pigments selected from the group consisting of: titanium dioxide, barium titanate, strontium titanate, and barium strontium titanate.

* * * * *